United States Patent [19]
Tsutsui et al.

[11] Patent Number: 5,905,650
[45] Date of Patent: May 18, 1999

[54] FAILURE ANALYZER

[75] Inventors: Toshikazu Tsutsui, Tokyo; Masaaki Furuta, Hyogo, both of Japan

[73] Assignees: Mitsubishi Denki Kabushiki Kaisha, Tokyo; Ryoden Semiconductor System Engineering Corporation, Itami, both of Japan

[21] Appl. No.: 08/931,505

[22] Filed: Sep. 16, 1997

[30] Foreign Application Priority Data

Mar. 24, 1997 [JP] Japan ..................................... 9-069630

[51] Int. Cl.⁶ .............................. G06F 19/00; G06G 7/64; G06G 7/66
[52] U.S. Cl. ................................ 364/468.17; 364/468.01; 364/468.02; 364/468.18; 364/468.16; 702/183; 702/185; 702/186
[58] Field of Search ........................ 364/468.17, 468.01, 364/468.02, 468.05, 468.1, 468.12, 468.15, 468.16, 468.18, 468.19, 151, 149; 702/183, 185, 186; 705/6, 8, 11, 28, 29, 415

[56] References Cited

U.S. PATENT DOCUMENTS

| 5,219,765 | 6/1993 | Yoshida et al. ............................. 437/8 |
| 5,245,554 | 9/1993 | Tsuyama et al. ........................ 364/552 |
| 5,341,304 | 8/1994 | Sakomoto et al. ....................... 364/468 |
| 5,463,459 | 10/1995 | Morioka et al. ......................... 356/237 |
| 5,475,766 | 12/1995 | Tsuchiya et al. ........................ 382/144 |
| 5,598,341 | 1/1997 | Ling et al. .......................... 364/468.17 |

FOREIGN PATENT DOCUMENTS

| 61-253448 | 11/1986 | Japan . |
| 5-218163 | 8/1993 | Japan . |
| 6-275688 | 9/1994 | Japan . |

*Primary Examiner*—Reba I. Elmore
*Assistant Examiner*—Ramesh Patel
*Attorney, Agent, or Firm*—Oblon, Spivak, McClelland, Maier & Neustadt, P.C.

[57] ABSTRACT

Failures detected by a tester are collated with defects detected by a defect checking device (Step S6). The collation is performed by retrieving defects coincident with each failure within a tolerance R0. Based on a mean value of displacements between the failures and the defects which are coincident with each other, coordinate values of the defects are corrected (Step S10). The coordinate values are corrected only when a collating ratio S that is a ratio of failures with which defects are coincident to whole failures exceeds a constant value S0 (Step S7). As a result, a coordinate value of a defect having high precision is obtained.

20 Claims, 23 Drawing Sheets

COLLATING RATIO $S = \dfrac{2}{4} = \dfrac{1}{2}$ $Di = (x2-x1, y2-y1)$
$d = avr(D1, D2, D3, \cdots)$

|L2−L1| < |D1|, |D2|

F I G. 8
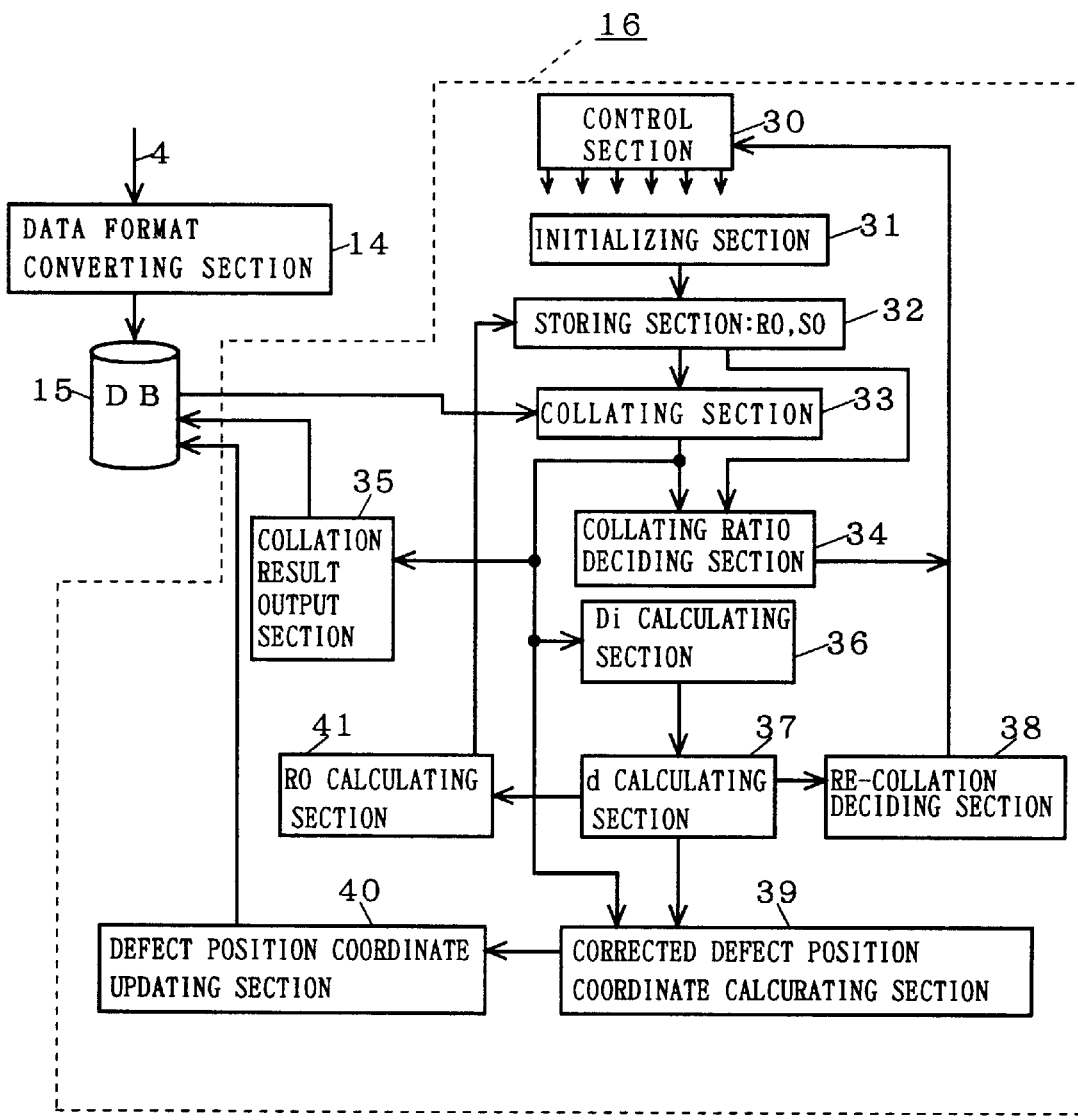

$Dix = X - x1$
$dx = avr(D1x, D2x, D3x, \cdots)$ $RX = F(dx)$

F I G. 1 4
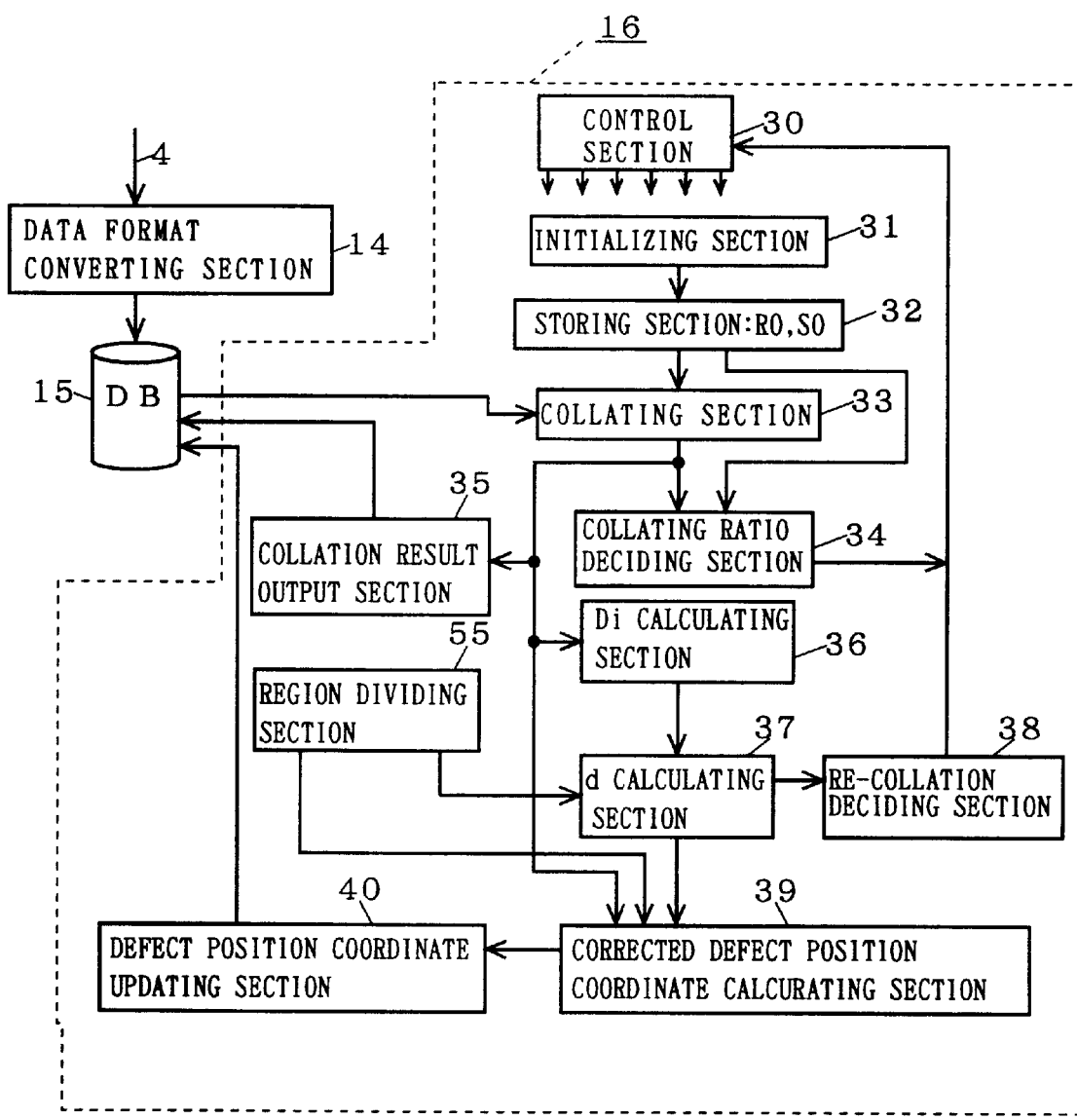

FAILURE ANALYZER

BACKGROUND OF THE INVENTION

1. Field of the Invention

The present invention relates to a failure analyzer for analyzing the cause of failures of a semiconductor device, and more particularly to an improvement of obtaining coordinate values of defects having high precision and enhancing precision of analysis.

2. Description of the Background Art

A method using a tester (which is also referred to as a LSI tester) has been known as a method for analyzing failures of a semiconductor wafer on which a plurality of semiconductor chips are formed, each semiconductor chip having a plurality of memory cells (generally arranged in a matrix of rows and columns). According to this method, a test of electrical characteristics is performed for all the memory cells in the semiconductor wafer, failures detected as a result of the test are displayed in the form of a failure pattern (generally referred to as a fail bit map (FBM)) in a coordinate space defined by a longitudinal x-coordinate and a transverse y-coordinate, and the cause of failures is estimated by using the FBM.

Although a three-dimensional position of a failure and a knowledge of electrically abnormal phenomena thereon, that is, a knowledge of failure phenomena that anything (leakage/open/short circuit, etc.) is caused in any place are directly obtained by the FBM, the cause of failures is not indicated directly. On the site of manufacture or checks, the FBM is not enough to improve failed portions. Therefore, it is necessary to make the cause of the failure phenomena in manufacturing process clear.

A method proposed on the basis of such a thought has been disclosed in Japanese Unexamined Patent Publication No. 6-275688. According to this method, a defect checking device is used to obtain the results of a physical check such as foreign substances, defects and the like on a surface of a semiconductor wafer for each step of a manufacturing line (these abnormalities which might be the cause of failures are represented by "defects" in this specification). At the same time, a test of electrical characteristics is performed, by using a tester, for each memory cell of the semiconductor wafer manufactured through the manufacturing line. A FBM obtained on the basis of results of the test is collated with the results of the physical check related to the defects for each step. Consequently, it is estimated whether the failures are caused by defects generated at each manufacturing step or not.

The results of the check are collated with the FBM by retrieving, for each step, defects existing in a predetermined tolerance around each failure belonging to the FBM which are obtained by the defect checking device. If the tolerance has a proper size, it is estimated that the defects existing in the tolerance are the cause of failures. If a position of each failure of the FBM is closer to that of the defect obtained by the defect checking device, there is a higher possibility that the defect might be the cause of the failure.

If precision of the position of the defect is sufficiently high, the position of each failure of the FBM is ideally coincident with that of the defect which causes the failure. However, the results of the check vary from one to another in the form of data and in the precision of the position of the defect for each defect checking device to be used at each step. For example, the precision of the position of the defect is reflected by precision of a position of a stage on which the semiconductor wafer to be checked is mounted, and the like.

It is necessary to increase the tolerance for the results of a check having low precision of a position. For this reason, reliability of a collation is lowered. In the case where results of a check having high precision of a position and those of a check having low precision of a position are collated in the same processing, a tolerance should be adapted to poor precision of the position. Therefore, the reliability is wholly lowered. FIGS. 28 and 29 are diagrams for explaining these circumstances.

As shown in FIG. 28, a point failure 20 acting as one of FBMs and a defect 23 in an x-y coordinate system are collated with each other by retrieving the defect 23 existing in a tolerance r1 (or r2) from the point failure 20. More specifically, the defect 23 existing in a circular region 21 (or 22) having the point failure 20 as a center and the tolerance r1 (or r2) as a radius is retrieved. At this time, the tolerance r1 for a collation with the results of a check obtained by a defect checking device having high precision of a position and the tolerance r2 for a collation with the results of a check obtained by a defect checking device having low precision of a position have the following relationship.

$$r1 < r2 \qquad (1)$$

As shown in FIG. 29, a line failure 25 which replaces the point failure is collated with the defect 23 by retrieving the defect 23 existing in the tolerance r1 (or r2) from the line failure 25. More specifically, the defect 23 existing in a region 26 (or 27) in which a distance from the line failure 25 is within the tolerance r1 (or r2) is retrieved. Accordingly, if a tolerance is set widely corresponding to low precision of a position, the defect 23 which is not related to the point failure 20 or the line failure 25 is collated. As a result, reliability of results of a collation, that is, precision of analysis of the cause of failures is lowered.

If the precision of a position of a defect is not good and a coordinate value of the defect having high precision can be obtained by proper correction, the reliability of the results of a collation can be enhanced and the defect can quickly be found and analyzed by using the coordinate value of the defect for another analyzer such as a SEM (scanning electron microscope) to which a coordinate linkage function is added.

SUMMARY OF THE INVENTION

The present invention relates to a failure analyzer for estimating the cause of failures by collating coordinate values of a first group of failures in a semiconductor wafer which are detected by a tester with coordinate values of a second group of defects in the semiconductor wafer which are detected by defect checking device on the basis of data on the first and second groups.

A first aspect of the present invention is directed to a failure analyzer, comprising initializing means for setting a tolerance and a collating ratio reference value, collating means for retrieving, from the second group, defects coincident with each failure of the first group, that is, defects having coordinate values within the tolerance around a coordinate value of the each failure, collating ratio deciding means for calculating a collating ratio which is a ratio of failures with which defects are coincident to all failures of said first group, and for comparing the collating ratio with the collating ratio reference value, displacement calculating means for calculating displacements from each of the failures with which defects are coincident to the coincident defects, mean value calculating means for calculating a mean value of the displacements as a correction variable, corrected defect position coordinate calculating means for calculating corrected defect position coordinates by subtracting the correction variable from the coordinate values of the second group, defect position coordinate updating means for updating the coordinate values of the second group with the corrected defect position coordinates, and control means for letting the defect position coordinate updating means update the coordinate values of the second group only when the collating ratio exceeds the collating ratio reference value in a comparison performed by the collating ratio deciding means.

A second aspect of the present invention is directed to a failure analyzer, comprising initializing means for setting a tolerance and a collating ratio reference value, collating means for retrieving, from the second group, defects coincident with each failure of the first group, that is, defects having coordinate values within the tolerance around a coordinate value of the each failure, displacement calculating means for calculating displacements from each of the failures with which defects are coincident to the coincident defects, mode calculating means for calculating a mode of the displacements as a correction variable, corrected defect position coordinate calculating means for calculating corrected defect position coordinates by subtracting the correction variable from the coordinate values of the second group, and defect position coordinate updating means for updating the coordinate values of the second group with the corrected defect position coordinates.

A third aspect of the present invention is directed to a failure analyzer, comprising initializing means for setting a tolerance and a collating ratio reference value, collating means for retrieving, from the second group, defects coincident with each failure of the first group, that is, defects having coordinate values within the tolerance around a coordinate value of the each failure, displacement calculating means for calculating displacements from each of the failures with which defects are coincident to the coincident defects, mean value calculating means for calculating a mean value of the displacements as a correction variable, mode calculating means for calculating a mode of the displacements as the correction variable, selecting means for selecting either of the mean value and the mode, corrected defect position coordinate calculating means for calculating a corrected defect position coordinates by subtracting the selected correction variable from the coordinate values of the second group, and defect position coordinate updating means for updating the coordinate values of the second group with the corrected defect position coordinates.

A fourth aspect of the present invention is directed to the failure analyzer according to the third aspect of the present invention, wherein the selecting means decides, on the basis of distribution of the displacements, whether the mean value or the mode precisely reflects an error of positions between the first and second groups, and selects, as the correction variable, one of the mean value and the mode which is decided to more precisely reflect the error.

A fifth aspect of the present invention is directed to the failure analyzer according to any of the first to fourth aspects of the present invention, wherein the displacement calculating means calculates, for a line failure of said first group, a displacement in a direction orthogonal to a direction of extension of the line failure as one of the displacements.

A sixth aspect of the present invention is directed to the failure analyzer according to any of the second to fourth aspects of the present invention, further comprising collating ratio deciding means for calculating a collating ratio which is a ratio of failures with which defects are coincident to all failures of said first group, and comparing the collating ratio with the collating ratio reference value, and control means for letting the defect position coordinate updating means update the coordinate values of the second group only when the collating ratio exceeds the collating ratio reference value in a comparison performed by the collating ratio deciding means.

A seventh aspect of the present invention is directed to the failure analyzer according to the first or sixth aspect of the present invention, wherein the control means controls the collating means in such a manner that the defects are retrieved again by the collating means after the coordinate values of the second group are updated by the defect position coordinate updating means.

An eighth aspect of the present invention is directed to the failure analyzer according to any of the second to fifth aspects of the present invention, further comprising control means for controlling the collating means in such a manner that the defects are retrieved again by the collating means after the coordinate values of the second group are updated by the defect position coordinate updating means.

A ninth aspect of the present invention is directed to the failure analyzer according to the seventh or eighth aspect of the present invention, further comprising re-collation deciding means for deciding whether or not the correction variable used by the corrected defect position coordinate calculating means is greater than a constant value, wherein the control means controls the collating means in such a manner that the defects are retrieved again by the collating means after the coordinate values of the second group are updated only when the re-collation deciding means decides that the correction variable is greater than the constant value.

A tenth aspect of the present invention is directed to the failure analyzer according to any of the seventh to ninth aspects of the present invention, further comprising tolerance calculating means for calculating a value of an increasing function for the corrected variable used by the corrected defect position coordinate calculating means and for updating the tolerance with the value of the increasing function.

An eleventh aspect of the present invention is directed to the failure analyzer according to the tenth aspect of the present invention, wherein the tolerance calculating means individually sets the increasing function for each type of a point failure and two kinds of line failures orthogonal to each other so as to individually update the tolerance for the each type of the failures, and the collating means retrieves the defects by individually using the corresponding tolerance depending on whether each failure of the first group is the point failure or one of the two kinds of orthogonal line failures when retrieving the defects again.

A twelfth aspect of the present invention is directed to the failure analyzer according to any of the seventh to ninth aspects of the present invention, further comprising variance calculating means for calculating a variance of the displacements calculated by the displacement calculating means, and tolerance calculating means for calculating a value of an increasing function for the variance and updating the tolerance with the value of the increasing function.

A thirteenth aspect of the present invention is directed to the failure analyzer according to any of the first to twelfth aspects of the present invention, further comprising region dividing means for dividing the semiconductor wafer into a plurality of regions, wherein the correction variable is individually calculated for the regions.

According to the first aspect of the present invention, the coordinate values of the defects are updated with the corrected defect position coordinates calculated on the basis of the mean value of the displacements. Consequently, it is possible to obtain coordinate values of defects having high precision which reduce an error caused by a shift of a stage for mounting the semiconductor wafer provided in the checking device, and the like. Furthermore, only when the collating ratio is greater than the collating ratio reference value, the coordinate values of the defects are corrected. Therefore, it is possible to prevent precision of correction from being deteriorated due to the defects which should not essentially be coincident but are accidentally coincident. Thus, the coordinate values of the defects can be obtained with higher precision.

According to the second aspect of the present invention, the coordinate values of the defects are updated with the corrected defect position coordinates calculated on the basis of the mode of the displacements. Consequently, it is possible to obtain coordinate values of defects having high precision which reduce an error caused by a shift of the stage and the like. In particular, when the mean value of the displacements does not precisely reflect the error, coordinate values of defects having high precision can be obtained.

According to the third aspect of the present invention, the coordinate values of the defects are updated with the corrected defect position coordinates calculated on the basis of the mean value or mode of the displacements. Consequently, it is possible to obtain coordinate values of defects having high precision which reduce an error caused by a shift of the stage and the like. In particular, either of the mean value and the mode can be selected as the correction variable. Therefore, coordinate values of defects having higher precision can be obtained by properly selecting the mean value or the mode which more precisely reflects the error.

According to the fourth aspect of the present invention, since the mean value or the mode is properly selected on the basis of the distribution of the displacements, an operator does not need to select either of them.

According to the fifth aspect of the present invention, the displacement in the direction orthogonal to the direction of extension is calculated as the displacement of the line failure. As a result, the corrected defect position coordinate is calculated on the basis of the displacement calculated according to the type of the failure. Accordingly, also in the case where the point failure and the line failure exist together, coordinate values of defects having high precision can be obtained.

According to the sixth aspect of the present invention, only when the collating ratio is greater than the collating ratio reference value, the coordinate values of the defects are corrected. Consequently, it is possible to prevent precision of correction from being deteriorated due to the defects which should not essentially be coincident but are accidentally coincident. Thus, the coordinate values of the defects can be obtained with higher precision.

According to the seventh aspect of the present invention, after the coordinate values of the group of defects are updated, the defects are retrieved again on the basis of the updated coordinate values. In other words, a re-collation is executed on the basis of coordinate values having high precision. Consequently, a result of a collation having high precision and reliability can be obtained.

According to the eighth aspect of the present invention, after the coordinate values of the group of defects are updated, the defects are retrieved again on the basis of the updated coordinate values. In other words, a re-collation is executed on the basis of coordinate values having high precision. Consequently, a result of a collation having high precision and reliability can be obtained.

According to the ninth aspect- of the present invention, if the correction variable is equal to or smaller than a constant value, the re-collation is not executed. Consequently, when the precision of the coordinate values of the defects is sufficiently high and the correction variable is fully small, it is possible to prevent the re-collation from being repeated unnecessarily.

According to the tenth aspect of the present invention, the tolerance is updated with the value of the increasing function of the correction variable. Therefore, when the correction variable is decreased, the re-collation is executed on the basis of a smaller tolerance. In other words, as the coordinate values of the defects approximate true coordinate values, the tolerance is reduced more. Thus, it is possible to prevent defects which are not essentially coincident from being erroneously considered as defects which are coincident. Consequently, precision and reliability of a result of a collation can be enhanced.

According to the eleventh aspect of the present invention, the re-collation is executed on the basis of the tolerance updated according to the type of the failure. Therefore, in the case where the point failure and the line failure exist together, a result of the collation can be obtained with high precision and reliability.

According to the twelfth aspect of the present invention, the tolerance is updated with the value of the increasing function of the variance of the displacements. Therefore, the re-collation is performed on the basis of a proper tolerance depending on the degree of a variation in the displacements. Consequently, it is possible to prevent defects which are not essentially coincident from being erroneously considered as defects which are coincident. Thus, precision and reliability of a result of a collation can be enhanced.

According to the thirteenth aspect of the present invention, the semiconductor wafer is divided into a plurality of regions and the correction variable is individually calculated for the regions. Therefore, even if the shift of a stage includes that of rotation, coordinate values of defects having high precision can be obtained.

These and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a block diagram showing a device according to a second embodiment;

FIG. 14 is a block diagram showing a device according to a fourth embodiment;

DESCRIPTION OF THE PREFERRED EMBODIMENTS

<1. First Embodiment>

First of all, a failure analyzer according to a first embodiment will be described below.

<1-1. System>

Figure 2:
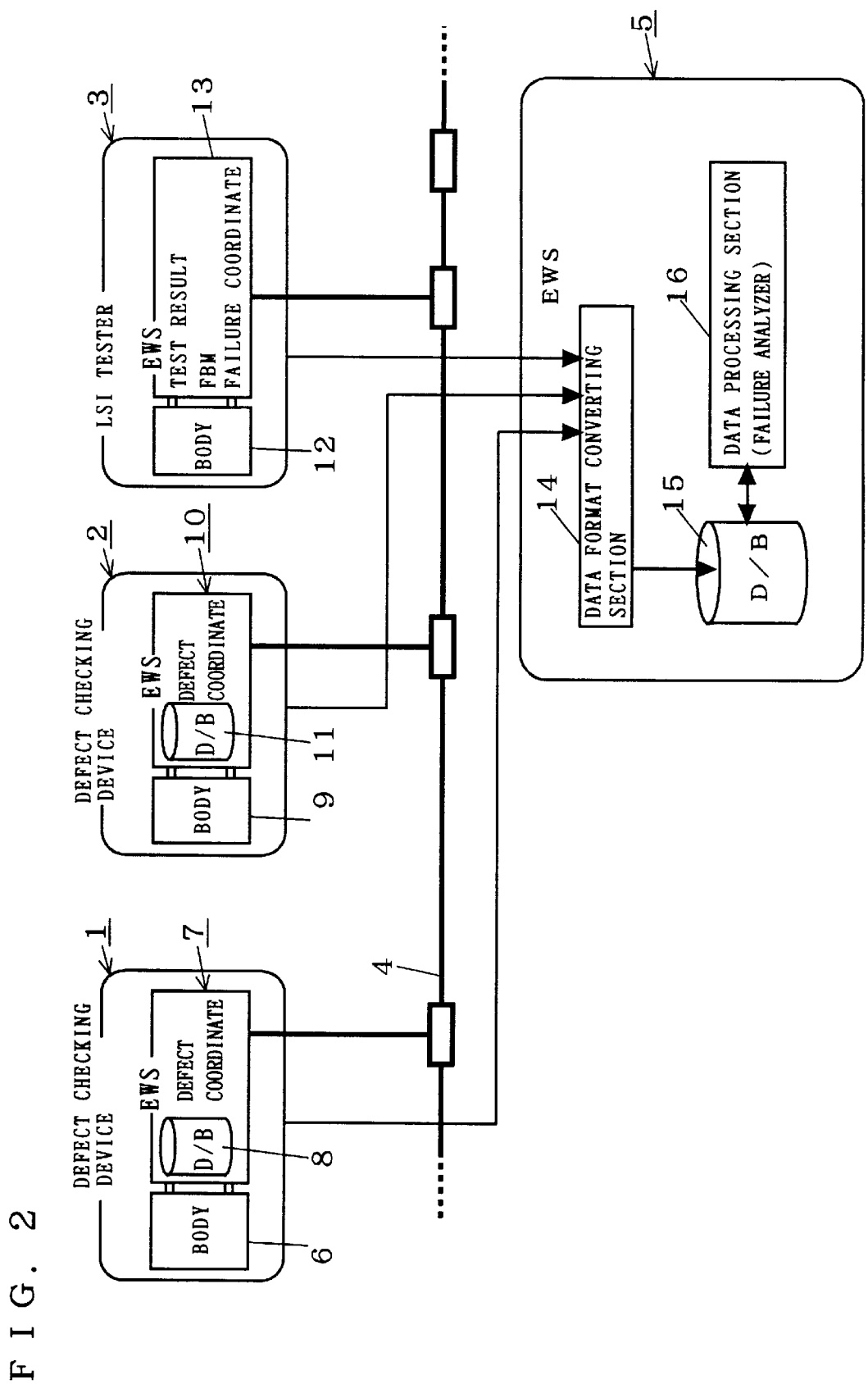
FIG. 2 is a block diagram showing a system comprising a device according to each embodiment.

FIG. 2 is a block diagram showing a whole structure of a system comprising a failure analyzer according to each embodiment. As shown in FIG. 2, the system comprises two kinds of defect checking devices 1 and 2, a tester 3 and an engineering work station (EWS) 5 connected to the defect checking devices 1 and 2 and the tester 3 through a LAN 4, for example. Each of the defect checking devices 1 and 2 is provided for each manufacturing step. The tester 3 is provided on a final stage of the manufacturing step.

The defect checking device 1 includes a body section 6 and an EWS 7. The EWS 7 has a storage medium 8 such as a magnetic disk for storing a data base. Similarly, the defect checking device 2 includes a body section 9 and an EWS 10.

The EWS 10 has a storage medium 11. The tester 3 includes a body section 12 and an EWS 13.

Figure 3:
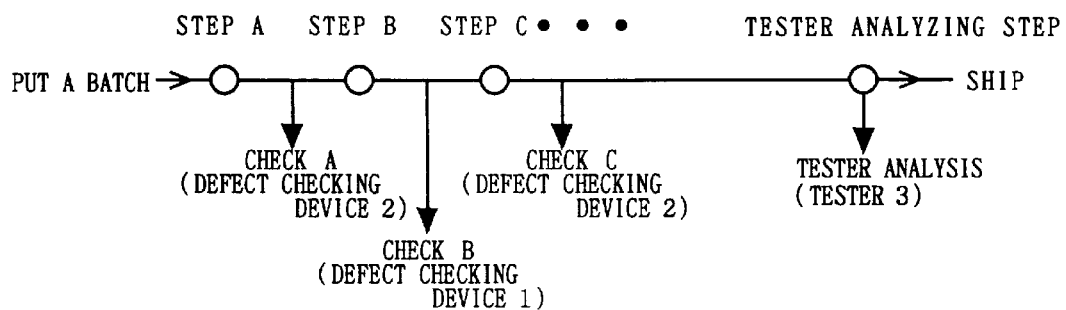
FIG. 3 is a diagram showing a flow of operation of the system in FIG. 2.

FIG. 3 is a diagram showing a flow of steps according to a manufacturing line of a semiconductor wafer. As shown in FIG. 3, a batch of untreated semiconductor wafers are first put in. Then, a predetermined integrated circuit is sequentially built in the semiconductor wafer through various manufacturing steps illustrated by steps A, B, C, . . . D. Defect checking is performed for each of the steps A, B, C, . . . For example, a check A using the defect checking device 2 is performed after the step A, and a check B using the defect checking device 1 is performed after the step B. Furthermore, a check C using the defect checking device 2 is performed after the step C.

After the integrated circuit is built in the semiconductor wafer through the steps A, B, C, . . . , a tester analyzing step is performed. In other words, tester analysis using the tester 3 is executed. Then, the semiconductor wafer is divided into individual semiconductor chips. Thereafter, the semiconductor chip is completed as a semiconductor device and is then shipped.

Returning to FIG. 2, the body section 6 provided in the defect checking device 1 operates on the semiconductor wafer to be checked and detects predetermined kinds of defects. The EWS 7 creates defect data which include coordinate values of the defects detected by the body section 6, sizes in a direction of an x-coordinate axis or a y-coordinate axis of the detected defects, and the like. The defect data is stored as a data base in the storage medium 8 provided in the EWS 7.

Similarly, the body section 9 provided in the defect checking device 2 operates on the semiconductor wafer and detects defects other than those detected by the body section 6. The EWS 10 creates defect data on the defects detected by the body section 9. The defect data is stored as a data base in the storage medium 11.

The body section 12 provided in the tester 3 executes an operation test of each portion (for example, a memory cell) of the semiconductor wafer to decide whether their operation is good or bad. The EWS 13 creates test data which include a coordinate value of each tested portion and Pass/Fail on the basis of results of decision obtained by the body section 12. The decision of "Fail" obtained by the tester 3 is referred to as a "FBM (Fail Bit Map) failure" or "failure". Test data on the FBM failure is referred to as "FBM failure data".

The defect data obtained by the defect checking devices 1 and 2 and the FBM failure data obtained by the tester 3 are sent to the EWS 5 through the LAN 4. The EWS 5 includes a data format converting section 14, a storage medium 15 and a data processing section 16. The data processing section 16 is equivalent to a failure analyzer. The defect data and FBM failure data sent to the EWS 5 are stored as a data base in the storage medium 15 through the data format converting section 14.

The data format converting section 14 executes so-called data format conversion and physical position conversion for coordinate values included in the FBM failure data. More specifically, a coordinate system which is a reference of the coordinate value of the FBM failure is converted into a coordinate system which is a reference of the coordinate values of the defects obtained by the defect checking devices 1 and 2, that is, a physical position coordinate system. In other words, the coordinate system of the FBM failure data is unified into the coordinate system of the defect data. Consequently, a position of the defect and that of the FBM failure are represented by a common coordinate system. Their positions can be compared with each other.

Figure 28:
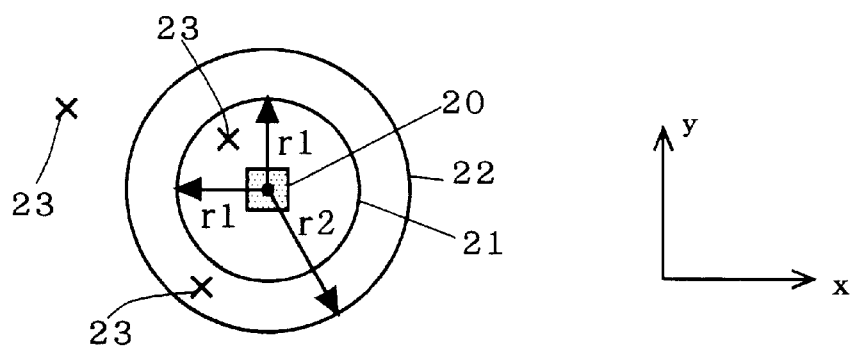
FIG. 28 is a diagram for explaining a concept of a tolerance.
Figure 29:
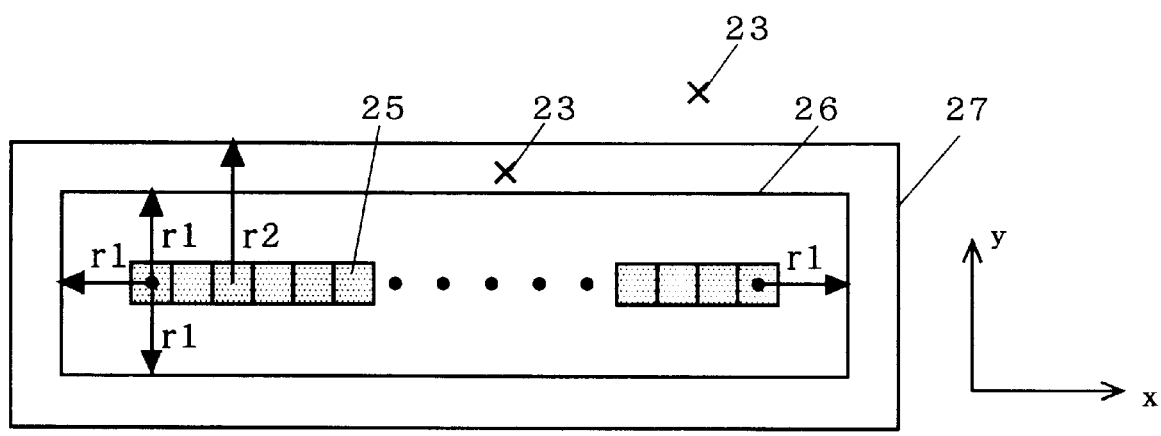
FIG. 29 is a diagram for explaining a concept of the tolerance.

Furthermore, the data format converting section 14 decides a type of the FBM failure, that is, whether it is the point failure 20 shown in FIG. 28 or the line failure 25 shown in FIG. 29 (so-called failure pattern recognition). Information about the type of the FBM failure is also added to the FBM failure data. Such information about the type may be added before the EWS 13 provided in the tester 3 creates the FBM failure data. The defect data and the FBM failure data which have been subjected to a predetermined processing by the data format converting section 14 are stored in the storage medium 15 and are utilized by the data processing section 16 and the like.

<1-2. Structure and Operation of Failure Analyzer>

Figure 4:
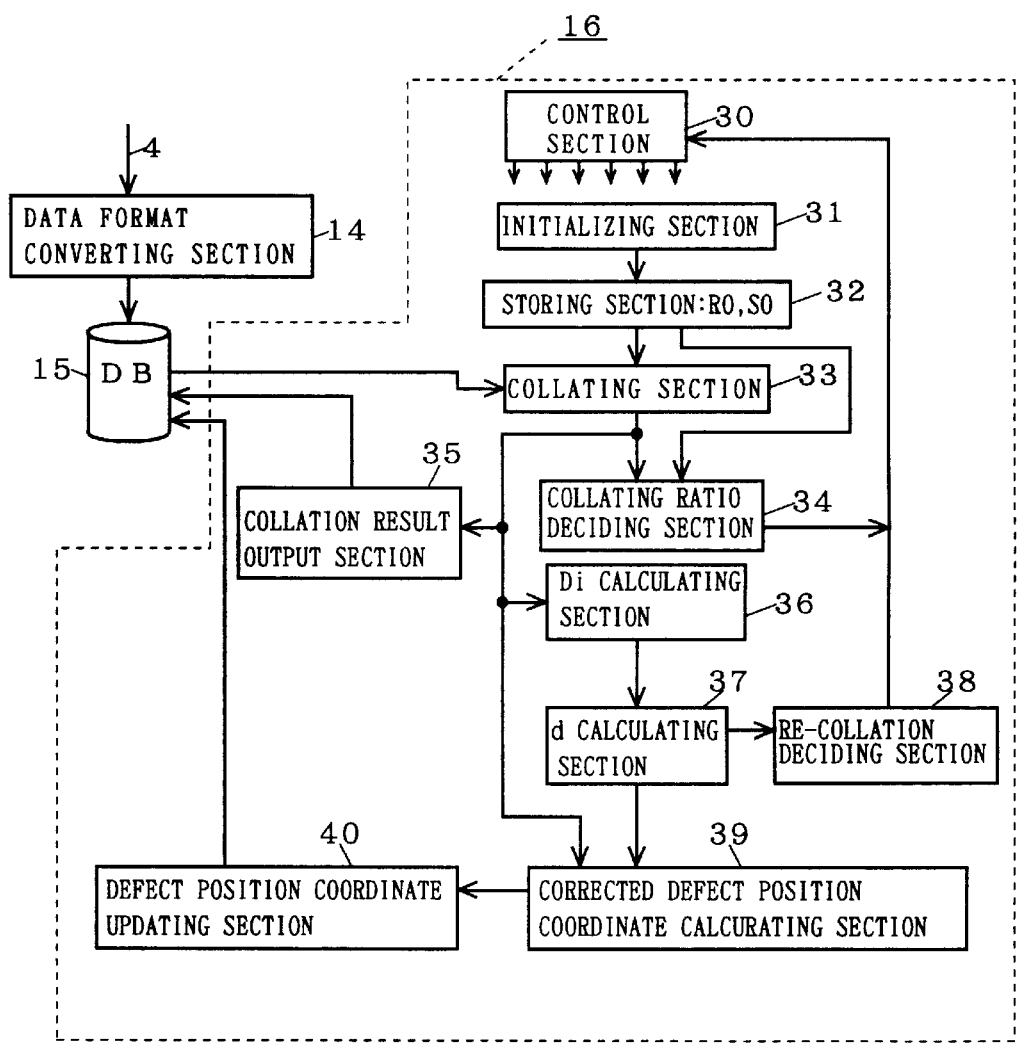
FIG. 4 is a block diagram showing the device according to the first embodiment.

FIG. 4 is a block diagram showing an internal structure of the data processing section 16. As shown in FIG. 4, the data processing section 16 has a control section 30. While a signal line is omitted, the control section 30 serves to control operation of each device section, for example, to adjust an operation period in such a manner that other device sections including an initializing section 31 provided in the data processing section 16 execute processings according to a predetermined flow which will be described below. An arrow shown in FIG. 4 indicates a signal line and a direction of a flow of a signal at the same time.

Figure 1:
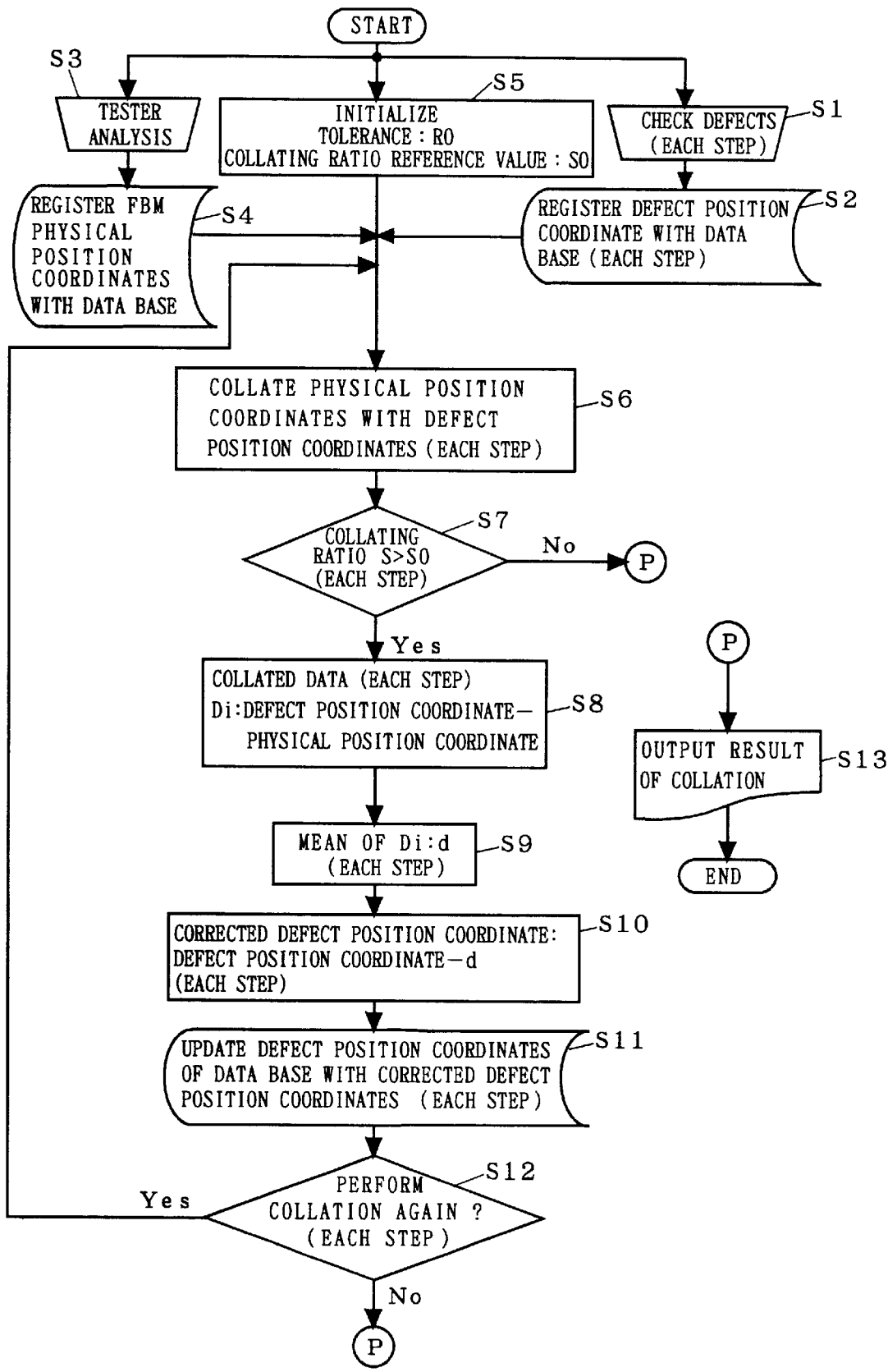
FIG. 1 is a flowchart of a system comprising a device according to a first embodiment.

FIG. 1 is a flowchart showing a flow of operation of the system (FIG. 2) including the data processing section 16. When the operation of the system is started, a check is first executed by the defect checking devices 1 and 2 at Step S1. Then, defect data (including coordinates of positions of defects) obtained by the check is sent to the EWS 5 and registered with the storage medium 15 through the data format converting section 14 at Step S2. As described above, Steps S1 and S2 are executed as the checks A, B, C, . . . for each of the steps A, B, C, . . .

At Step S3, tester analysis is executed by the tester 3. At Step S4, the FBM failure data obtained by the tester analysis is then sent to the EWS 5 and is registered with the storage medium 15 through the data format converting section 14. As described above, the FBM failure data to be registered includes types of the FBM failures and coordinate values on the physical position coordinate system.

Processings at and after Step S5 are performed by the data processing section 16. Accordingly, the processings at and after Step S5 will be described below with reference to both FIGS. 1 and 4. The processing at Step S5 is performed before, during, or after Steps S1 to S4. At Step S5, initialization is executed. In other words, a value of a tolerance R0 and a collating ratio reference value S0 are set. This processing is performed by the initializing section 31. A set value is stored in a storing section 32.

The tolerance R0 is a concept equivalent to the tolerance r1 (or r2) illustrated in FIGS. 28 and 29, and is set to a value which is greater than errors of positions between the FBM failures and the defects derived from various causes, for example, a value ranging from 300 $\mu$m to 500 $\mu$m. The collating ratio reference value S0 is to be compared with a collating ratio which will be described below.

At Step S6, coordinate values of positions of the FBM failures are collated with those of positions of the defects. This processing is performed by a collating section 33. More specifically, the collating section 33 searches for defects existing within the tolerance R0 around each FBM failure on the basis of the tolerance R0 stored in the storing section 32 and the coordinate values of the FBM failures and the defects stored in the storage medium 15.

At this time, one of the checks A, B, C, . . . respectively performed after the steps A, B, C, . . . is selected, and defects obtained by the selected check are subjected to a collation. Processings at Steps S6 to S12 are performed for each of the steps A, B, C, . . . The processing at Step S5 may be performed for each of the steps A, B, C, . . . In the latter case, the tolerance R0 and the collating ratio reference value S0 are also set individually for each of the steps A, B, C, . . . The collating section 33 selectively reads defect data on any of the steps as a target of a collation from the storage medium 15 on the basis of a designation of the control section 30.

Figure 5:
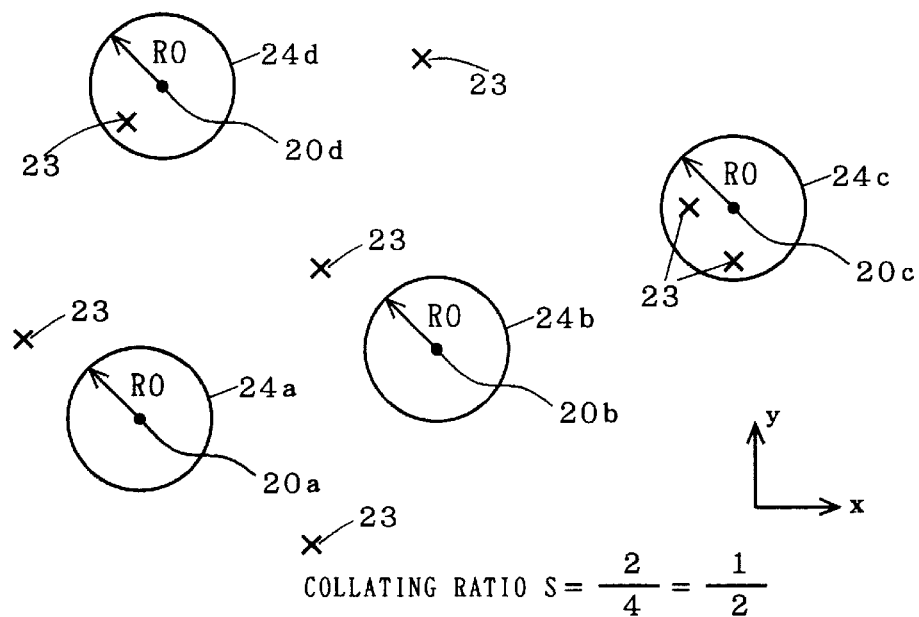
FIG. 5 is a diagram for explaining operation of the device according to the first embodiment.

At Step S7, a collating ratio S is compared with the collating ratio reference value S0. This processing is performed by a collating ratio deciding section 34. The collating ratio deciding section 34 first calculates the collating ratio S on the basis of a result of the collation performed by the collating section 33. FIG. 5 is a diagram for explaining operation of calculating the collating ratio S.

In an example shown in FIG. 5, four point failures 20a to 20d are found in the semiconductor wafer. Only two point failures 20c and 20d have defects 23 having coincident coordinate values. A coincidence of the FBM failure with the defect or a coincidence of their coordinate values means that the defect 23 exists in a region in which a distance from the FBM failure is within the tolerance R0. In general, a plurality of defects are sometimes coincident with one FBM failure.

The defect 23 is not found in regions 24a and 24b in which distances from the point failures 20a and 20b are within the tolerance R0 respectively, but is found only in regions 24c and 24d incidental to the point failures 20c and 20d. A plurality of defects 23 are found for the point failure 20c. In this case, the collating ratio S is calculated as follows.

$$S = 2/4 = 1/2 \qquad (2)$$

In other words, the collating ratio S is defined as a ratio of the number of the FBM failures which are coincident with defects to the total number of the FBM failures.

Then, the collating ratio deciding section 34 reads the collating ratio reference value S0 stored in the storing section 32, and compares the read collating ratio reference value S0 with the calculated collating ratio S. The tolerance R0 has been set to the value which is greater than the error in position between the FBM failures and the defects. Therefore, if a step including the cause of FBM failures is collated, defects coincident with the FBM failures are found. However, since the tolerance R0 is set greater, there is a possibility that the coincident defects might include defects which are not coincident to be exact.

A result of comparison performed by the collating ratio deciding section 34 is sent to the control section 30. If the collating ratio S is greater than the collating ratio reference value S0, the control section 30 activates a Di calculating section 36 and the like to perform processings at and after Step S8. Conversely, if the collating ratio S is not greater than the collating ratio reference value S0, a collation result output section 35 is activated. Thus, the routine proceeds to Step S13.

Figure 6:
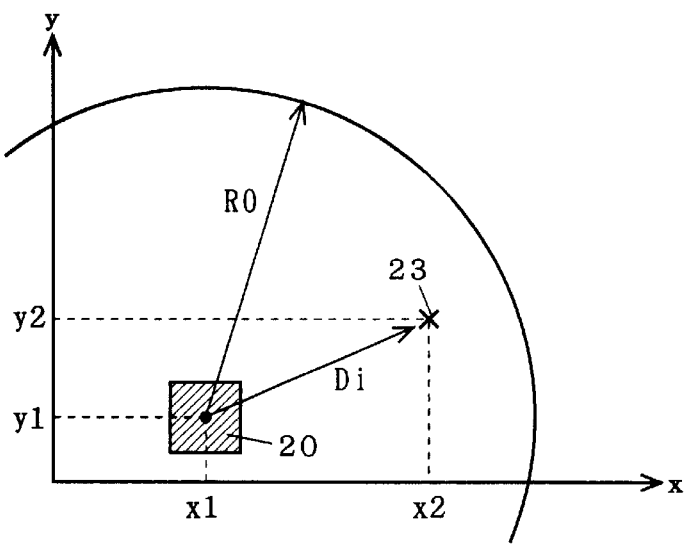
FIG. 6 is a chart for explaining the operation of the device according to the first embodiment.

At Step S8, displacements Di are calculated. This processing is performed by the Di calculating section 36. FIG. 6 is a chart for explaining operation of calculating the displacement Di. As shown in FIG. 6, the displacement Di is defined as differences in x and y components on a physical position coordinate system between a FBM failure and a defect which are coincident with each other. More specifically, if x and y components of the point failure 20 are indicated at x1 and y1 respectively, and x and y components of the coincident defect 23 are indicated at x2 and y2 respectively, an x component of the displacement Di is given by (x2−x1) and a y component thereof is given by (y2−y1). The Di calculating section 36 calculates the displacements Di for all the FBM failures which are coincident with the defects.

At Step S9, a mean value d of the displacements Di is calculated. This processing is performed by a d (mean value) calculating section 37. As described in a lowermost portion of FIG. 6, the d calculating section 37 calculates a mean value d of all the displacements Di calculated by the Di calculating section 36 for x and y components. More specifically, the x component of the mean value d is calculated as a mean value of the x components of all the displacements Di, and the y component of the mean value d is calculated as a mean value of the y components of all the displacements Di.

At Step S10, a corrected defect position coordinate is calculated. This processing is performed by a corrected defect position coordinate calculating section 39. More specifically, the corrected defect position coordinate calculating section 39 corrects coordinate values of all the defects related to a step collated, with the mean value d for each of x and y components. The x component of the mean value d is subtracted from that of the coordinate value of each defect, and the y component of the mean value d is subtracted from that of the coordinate value of each defect. The corrected defect position coordinate values thus obtained are sent to a defect position coordinate updating section 40.

Then, the routine proceeds to Step S11 where coordinate values included in the defect data stored in the storage medium 15 are updated with the corrected defect position coordinate values. This processing is performed by the defect position coordinate updating section 40. More specifically, the coordinate values of the defects are newly registered.

Subsequently, the routine proceeds to Step S12 where it is decided whether or not a collation based on the defect data which are newly updated with the corrected defect position coordinate, that is, a re-collation is executed. This processing is performed by a re-collation deciding section 38. For example, decision is performed on the basis of the mean value d. As an example, it is decided that the re-collation should be executed if the mean value d is greater than a predetermined reference value, and it is decided that the re-collation should not be executed if the mean value d is equal to or smaller than the predetermined reference value.

Instead, the re-collation deciding section 38 can have a structure in which the number of collations m ($\geq 2$) is preset and it is decided that a re-collation should be executed or not depending on whether the number of collations reaches the number m. In this case, the collation, that is, the processing of Step S6 is repeated m times unless a result of the decision at Step S7 is "No".

The result of the decision is sent from the re-collation deciding section 38 to the control section 30. If it is decided that the re-collation should be executed, the control section 30 activates the collating section 33 again. Consequently, the routine returns to Step S6 and the processings at and after Step S6 are repeated. In other words, a collation based on the newest defect data which is updated with the corrected defect position coordinate is executed.

Conversely, if it is decided that the re-collation should not be executed, the control section 30 activates the collation result output section 35. Consequently, the routine proceeds to Step S13. At Step S13, the collation result output section 35 outputs, to the storage medium 15, data on the result of the collation obtained by the collating section 33, that is, data on the coordinate value of each FBM failure, existence of defects coincident with the FBM failure and the like, for example.

<1-3. Advantage of Failure Analyzer>

In the failure analyzer according to the present embodiment, the coordinate values of the defects which are obtained by the defect checking devices 1 and 2 and registered with the storage medium 15 are corrected by the mean value d, and are updated with the corrected values. The defect checking devices 1 and 2 include a stage (not shown) on which the semiconductor wafer to be checked is mounted. The coordinate values of the defects are corrected by the mean value d so that an error of the coordinate value derived from a shift of the stage and the like is reduced or eliminated. In other words, a coordinate value of a defect having high precision is obtained.

By using a data base having high precision which is newly registered with the storage medium 15 for other analyzers, for example, devices utilizing coordinates of defects such as a SEM (scanning electron microscope) to which a coordinate linkage function is added, a FIB (focused ion beam device) and the like, the defects can quickly be found and analyzed.

In the failure analyzer according to the present embodiment, the collating ratio S is compared with the collating ratio reference value S0 by the collating ratio deciding section 34. Only when the collating ratio S is greater than the collating ratio reference value S0, the coordinate values of the defects are corrected. Consequently, when defects which are not essentially coincident exist accidentally within the tolerance R0, erroneous correction based on the defects can be avoided. In other words, precision of correction can be prevented from being deteriorated due to the defects which are accidentally coincident. Therefore, the coordinate values of the defects can be obtained with high precision.

In the failure analyzer according to the present embodiment, furthermore, a collation is executed again on the basis of the corrected defect position coordinates on predetermined conditions. In a defect checking device having poor precision of the coordinate value of a defect, for example, a defect detector which makes an error of 300 to 500 $\mu$m, generally, an error in a position of a defect has the following relationship:

$$\text{(Absolute error)} > \text{(Relative error)} \tag{3}$$

wherein the absolute error means an error for a physical position coordinate system, and the relative error means an error relative to the defects.

Figure 7:
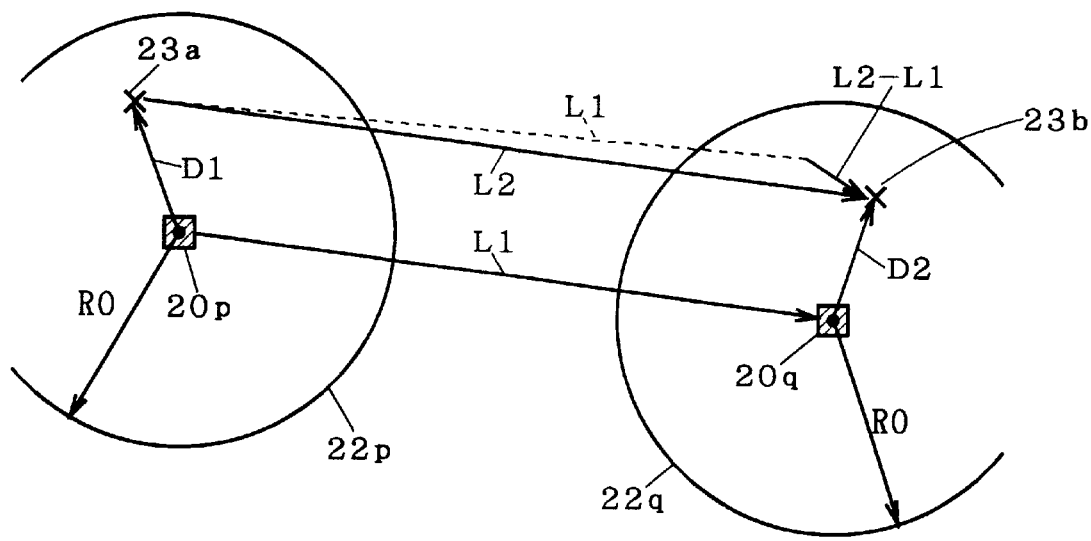
FIG. 7 is a diagram for explaining the operation of the device according to the first embodiment.

FIG. 7 is a diagram showing the relationship of the Equation 3. In an example of FIG. 7, a defect 23a is found in a region 22p in which a distance from a point failure 20p is within a tolerance R0, and a defect 23b is found in a region 22q in which a distance from a point failure 20q is within a tolerance R0. In other words, the defects 23a and 23b are coincident with the point failures 20p and 20q, respectively.

In this case, a displacement D1 of the defect 23a for the point failure 20p, a displacement D2 of the defect 23b for the point failure 20q, a vectorial distance L1 between the point failures 20p and 20q, and a vectorial distance L2 between the defects 23a and 23b normally have the relationship shown in FIG. 7. The magnitudes (absolute values) of displacements D1 and D2 are equivalent to the absolute error in the Equation 3, and the absolute value of a difference between the distances L2 and L1 (a difference in vector) is equivalent to the relative error in the Equation 3.

When such a relationship is valid, the corrected defect position coordinates obtained by subtracting the mean value d from the coordinate values of the defects 23a and 23b are close to the coordinate value of the FBM failure. Accordingly, the defects which are essentially coincident with the FBM failures and exist outside the tolerance R0 are properly returned into the tolerance R0 by performing a collation again on the basis of the corrected defect position coordinates. Furthermore, the defects which are not essentially coincident with the FBM failure and exist within the tolerance R0 are properly eliminated from the tolerance R0. Thus, results of a collation can be obtained with high precision and high reliability by performing the collation again on the basis of the corrected defect position coordinates.

<2. Second Embodiment>

Figure 9:
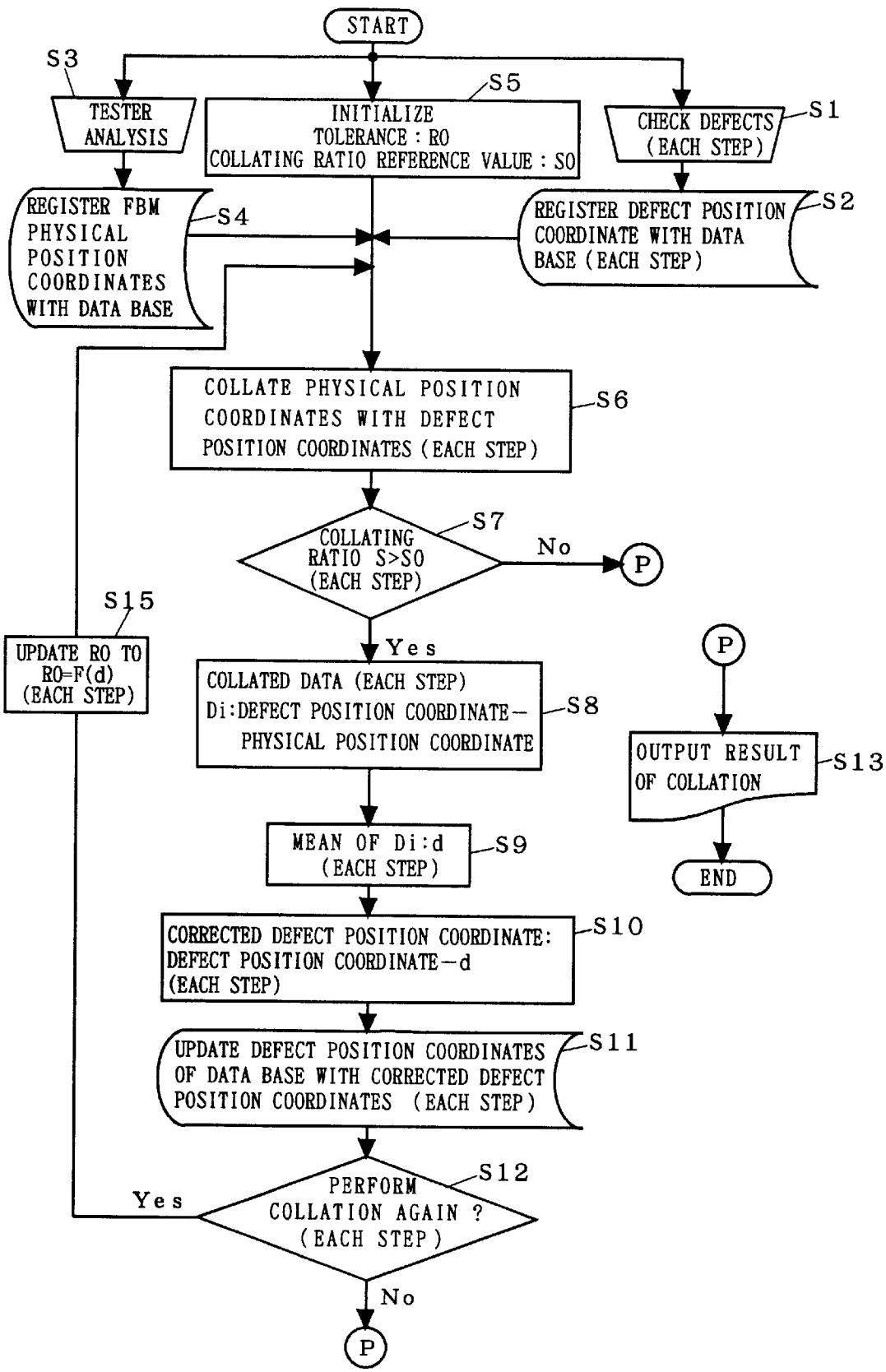
FIG. 9 is a flowchart of a system comprising the device according to the second embodiment.

FIG. 8 is a block diagram showing a structure of a failure analyzer according to a second embodiment. This failure analyzer is characteristically different from the failure analyzer according to the first embodiment shown in FIG. 4 in that a R0 calculating section 41 is provided. FIG. 9 is a flowchart showing a flow of operation of a system comprising the failure analyzer. Description will be given below with reference to FIGS. 8 and 9.

If it is decided that a collation should be executed again at Step S12, a processing of Step S15 is performed before a processing of Step S6 is started. This processing is performed by the R0 calculating section 41. The R0 calculating section 41 calculates a tolerance R0 to be newly set on the basis of a mean value d calculated by a d calculating section 37. A tolerance R0 stored in a storing section 32 is updated with a value of the new tolerance R0. At succeeding Step S6, the collation is executed again on the basis of the newly updated tolerance R0.

The mean value d used for updating the tolerance R0 may be a magnitude (absolute value) of the mean value d calculated by the d calculating section 37, it may be an x component of the mean value d, a y component thereof, or an operator may select one of them. The value of the new tolerance R0 is generally expressed by using a function F of the mean value d.

$$R0 = F(d) \quad (4)$$

The function F is an increasing function of a variable d, and is most simply a linear function given as follows.

$$F(d) = u \cdot d + v, \quad (u > 0) \quad (5)$$

Thus, the tolerance R0 depends on the mean value d. If the mean value d is greater, the tolerance R0 is increased so that a region in which a defect is coincident with a FBM failure is enlarged. Conversely, if the mean value d is smaller, the tolerance R0 is decreased so that the region in which a defect is coincident with a FBM failure is reduced. More specifically, while a first collation is executed on the basis of an initial value of the tolerance R0 which is set a little greater by the operator, second and succeeding collations are executed on the basis of the tolerance R0 which is properly set according to the mean value d. Consequently, precision and reliability of a result of the collation can be enhanced still more.

<3. Third Embodiment>

Figure 10:
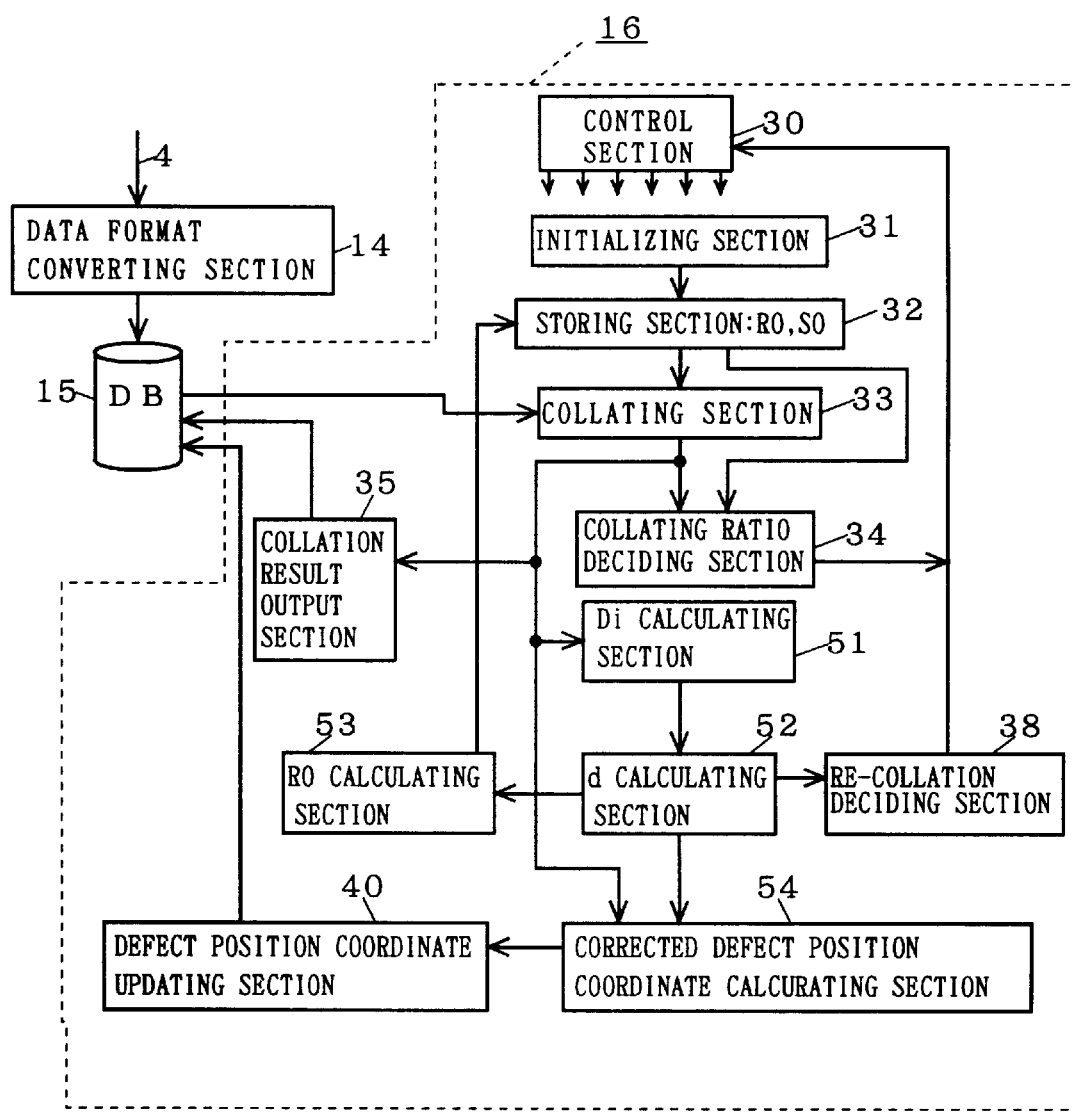
FIG. 10 is a block diagram showing a device according to a third embodiment.
Figure 11:
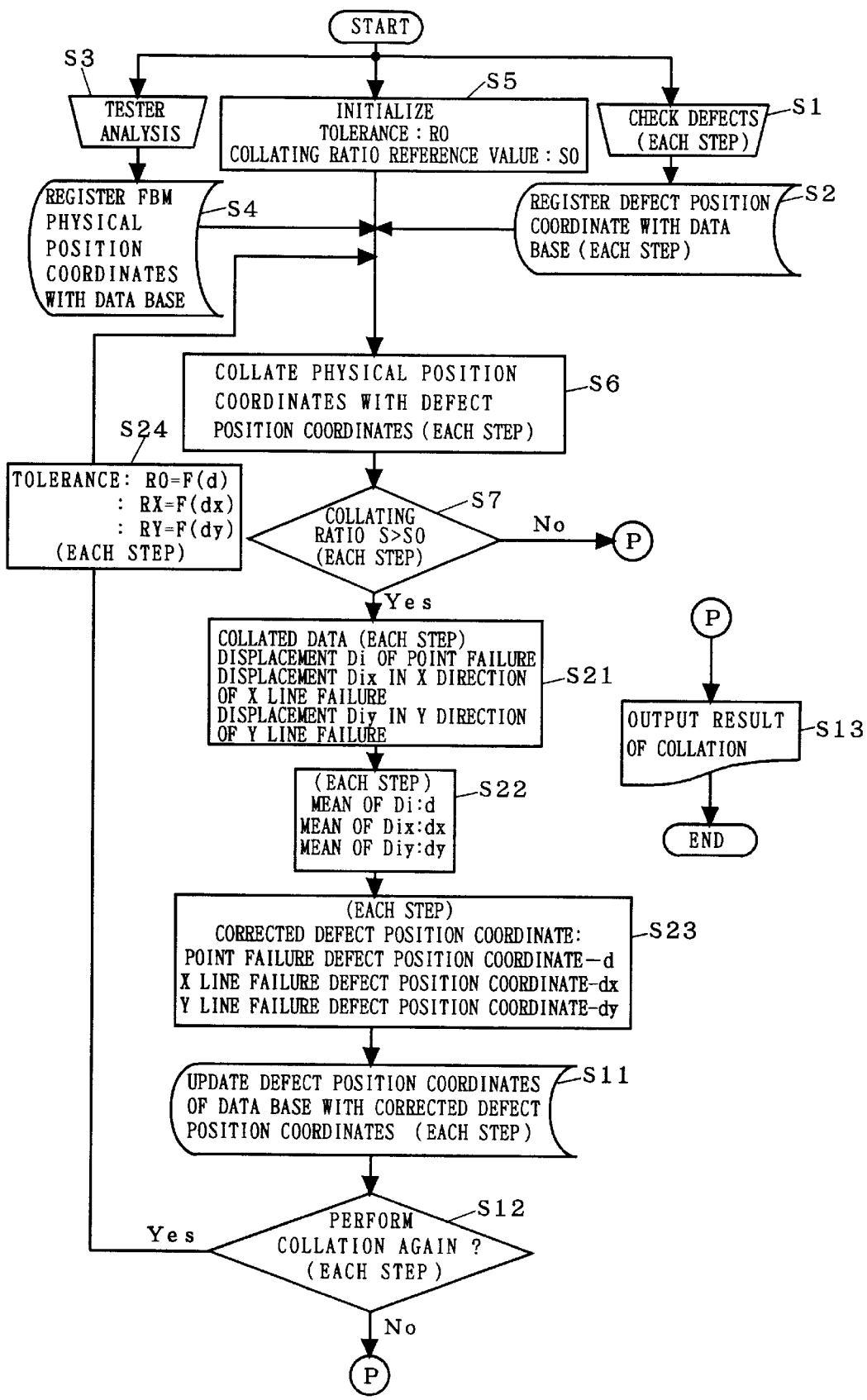
FIG. 11 is a flowchart of a system comprising the device according to the third embodiment.

FIG. 10 is a block diagram showing a structure of a failure analyzer according to a third embodiment. This failure analyzer is characteristically different from the failure analyzer according to the second embodiment shown in FIG. 8 in that a Di calculating section 51 is provided in place of the Di calculating section 36, a d calculating section 52 is provided in place of the d calculating section 37, a R0 calculating section 53 is provided in place of the R0 calculating section 41, and a corrected defect position coordinate calculating section 54 is provided in place of the corrected defect position coordinate calculating section 39. FIG. 11 is a flowchart showing a flow of operation of a system comprising the failure analyzer. Description will be given below with reference to FIGS. 10 and 11.

If it is decided that a collating ratio S is greater than a collating ratio reference value S0 at Step S7, the routine proceeds to Step S21. A processing of Step S21 is performed by the Di calculating section 51. The Di calculating section 51 individually calculates a displacement for each type of FBM failures. In other words, the displacement is individually calculated depending on whether the FBM failure is a point failure or a line failure and whether the line failure is an X line failure on a y-coordinate axis (therefore, an x-coordinate value is constant) or a Y line failure on an x-coordinate axis (therefore, a y-coordinate value is constant).

A layout of an integrated circuit built in a semiconductor wafer is obtained on the x- and y-coordinate axes. For example, memory cells are arranged in a matrix on the x- and y-coordinate axes, and a wiring is also arranged on the x- and y-coordinate axes. Consequently, since line failures which are slanted obliquely to the x- and y-coordinate axes do not exist, it is sufficient that only the X and Y line failures are considered as the line failure.

Figure 12:
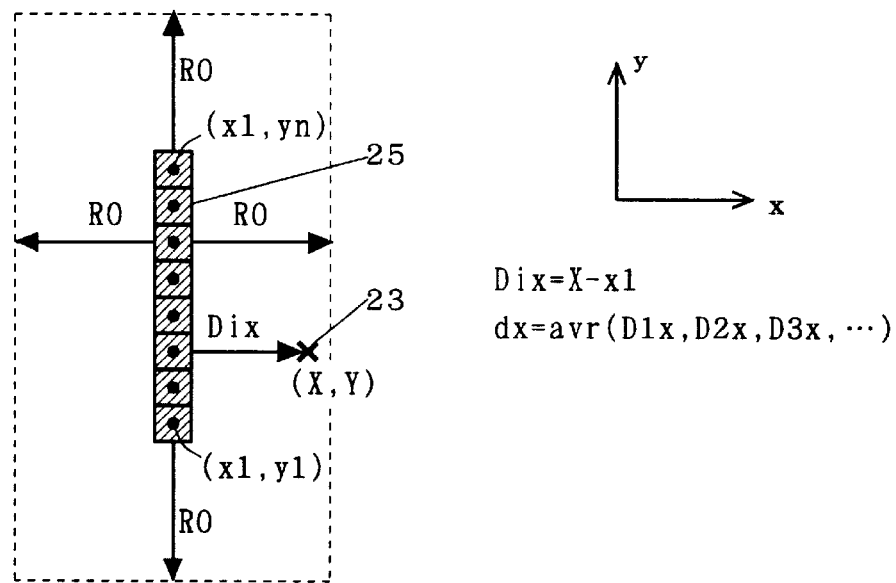
FIG. 12 is a diagram for explaining operation of the device according to the third embodiment.

For the FBM failure which is a point failure, a displacement Di is calculated by the method shown in FIG. 6. FIG. 12 is a diagram showing a method for calculating a displacement for the FBM failure which is a line failure. In FIG. 12, an example in which a line failure 25 is an X line failure is shown. The line failure 25 has coordinate values of (x1, y1), (x1, y2), . . . , (x1, yn).

Assuming that a defect 23 found in a region in which a distance from the line failure 25 is within an initialized tolerance R0 (a region enclosed by a dotted line), that is, a defect 23 coincident with the line failure 25 has a coordinate value (X, Y), a displacement Dix of the defect 23 from the X line failure is calculated as follows.

$$Dix = X - x1 \quad (6)$$

For the Y line failure, a displacement Diy is calculated in the same manner. More specifically, the displacements Dix and Diy in directions orthogonal to directions of extension of the line failure 25 are calculated for the line failure 25.

Thus, the displacement Di for the point failure, the displacement Dix for the X line failure, and the displacement Diy for the Y line failure are calculated by the Di calculating section 51 at Step S21. When the processing of Step S21 is completed, the routine proceeds to Step S22.

A processing of Step S22 is performed by the d calculating section 52. The d calculating section 52 calculates mean values of the displacements Di, Dix and Diy calculated by the Di calculating section 51. A mean value d of the displacement Di for the point failure is calculated in the procedure shown in FIG. 6. On the other hand, a mean value dx of the displacement Dix for the X line failure is calculated in the procedure shown in FIG. 12.

The mean value dx is calculated as a mean value of the displacements Dix (i=1, 2, . . . , j) for j (j≧1) X line failures coincident with the defects 23. Similarly, the mean value dy is calculated as a mean value of the displacements Diy (i=1, 2, . . . , k) for k (k≧1) Y line failures coincident with the defects 23. Thus, the displacements and mean value thereof are individually calculated according to the types of the FBM failures such as the point failure, the X line failure and the Y line failure.

When the processing of Step S22 is completed, the routine proceeds to Step S23. This processing is performed by the corrected defect position coordinate calculating section 54. The corrected defect position coordinate calculating section 54 individually corrects coordinate values of positions of defects coincident with the FBM failures for each type thereof.

For the defect coincident with the point failure, x and y components of the mean value d are subtracted from those of the coordinate value. For the defect coincident with the X line failure, the mean value dx is subtracted from the x component of the coordinate value, and the y component is not corrected. For the defect coincident with the Y line failure, the mean value dy is subtracted from the y component of the coordinate value and the x component is not corrected.

A corrected defect position coordinate obtained by the corrected defect position coordinate calculating section 54 is input to a defect position coordinate updating section 40. The defect position coordinate updating section 40 updates coordinate values included in defect data stored in a storage medium 15 to the input corrected defect position coordinate value.

If it is decided at Step S12 that a collation should be executed again, a processing of Step S24 is performed before a processing of Step S6 is started. This processing is performed by the R0 calculating section 53. The R0 calculating section 53 calculates a tolerance to be newly set on the basis of mean values d, dx and dy calculated by the d calculating section 52. A tolerance R0 to be stored in a storing section 32 is updated with a value of the new tolerance. In addition, the value of the new tolerance is individually given for each type of the FBM failures.

Figure 13:
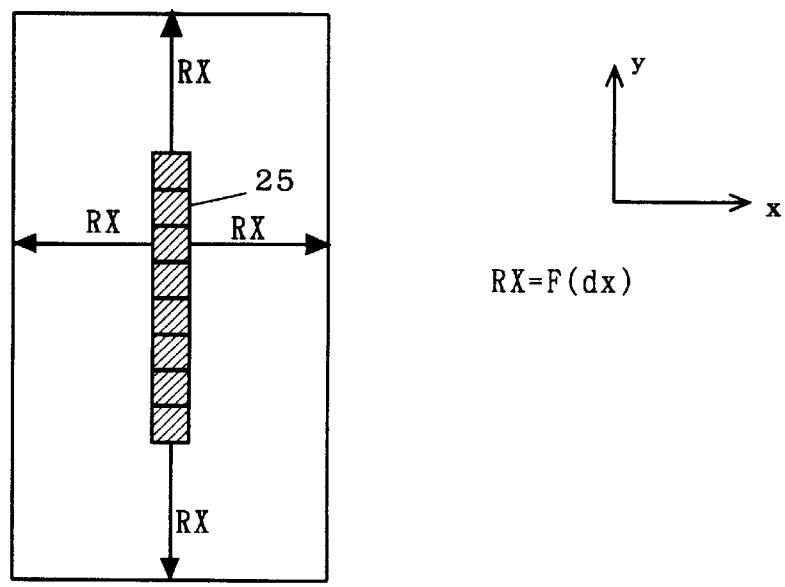
FIG. 13 is a diagram for explaining the operation of the device according to the third embodiment.

More specifically, the tolerance R0 for the point failure, the tolerance RX for the X line failure and the tolerance RY for the Y line failure are individually given. In the same manner as Step S15 (FIG. 9), the tolerance R0 for the point failure is given as a function F (d) of the mean value d. On the other hand, a tolerance RX which is not always coincident with the tolerance R0 is set for the X line failure as shown in FIG. 13. In addition, the tolerance RX is given as a function F (dx) of the mean value dx. Similarly, the tolerance RY is given as a function F (dy) of the mean value dy.

Each of the functions F ( ) is an increasing function, and is most simply a linear function expressed by the Equation 5. The three functions F () do not need to be identical to one another.

At succeeding Step S6, a collation is executed again on the basis of the newly updated tolerances. More specifically, the collation is executed for the point failure on the basis of the tolerance R0, for the X line failure on the basis of the tolerance RX and for the Y line failure on the basis of the tolerance RY, respectively.

In the failure analyzer according to the present embodiment described above, the position of the defect is properly corrected depending on the type of the FBM failure. Therefore, also in the case where the point failure and the line failure exist together, a corrected defect position coordinate having high precision can be obtained. The collation is executed again on the basis of the tolerances according to the types of the FBM failures together with the coordinate value having high precision. Consequently, also in the case where the point failure and the line failure exist together, a result of the collation can have high precision and reliability.

<4. Fourth Embodiment>

Figure 15:
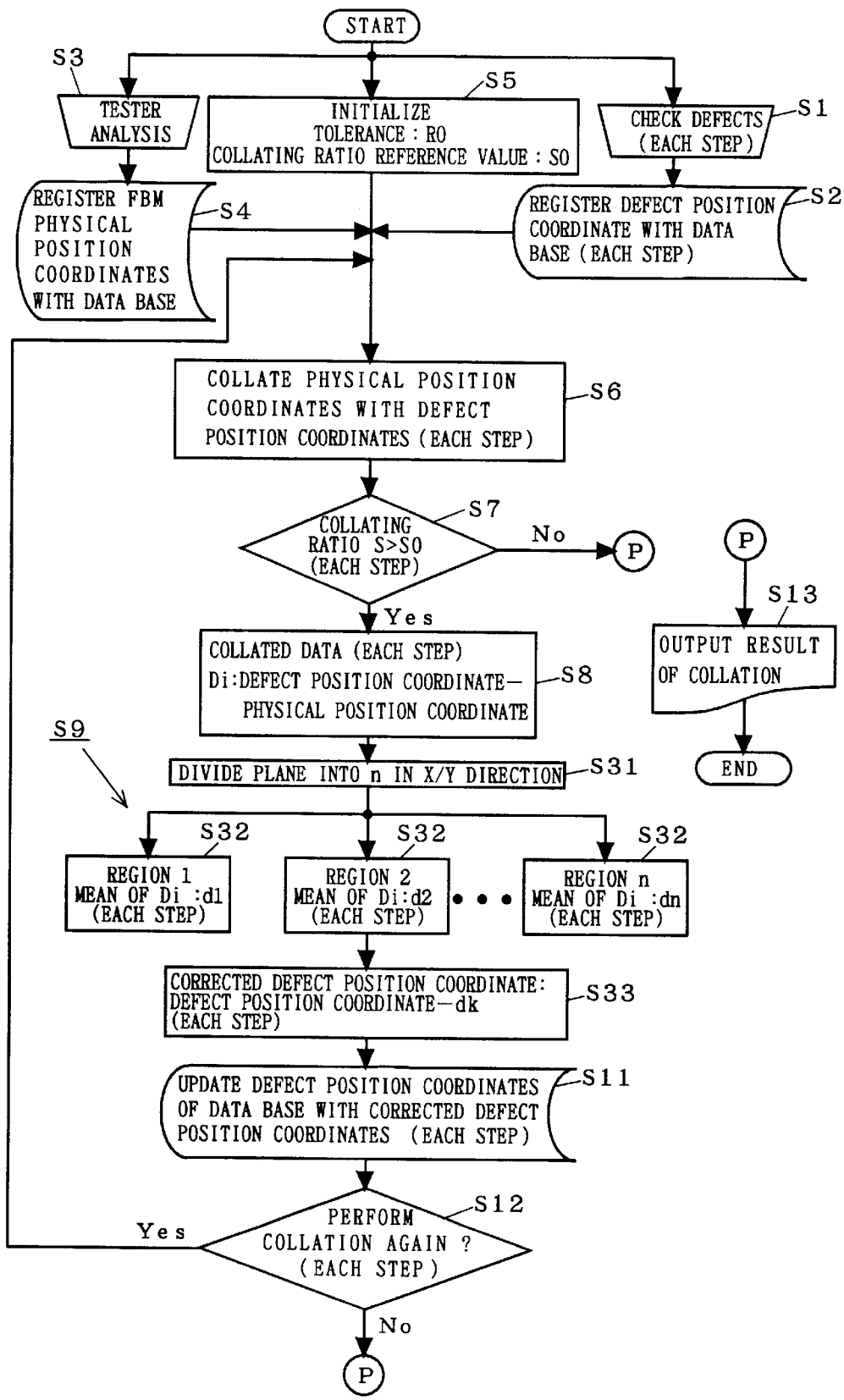
FIG. 15 is a flowchart of a system comprising the device according to the fourth embodiment.

FIG. 14 is a block diagram showing a structure of a failure analyzer according to a fourth embodiment. This failure analyzer is characteristically different from the failure analyzer according to the first embodiment shown in FIG. 4 in that a region dividing section 55 is provided. FIG. 15 is a flowchart showing a flow of operation of a system comprising the failure analyzer. Description will be given below with reference to FIGS. 14 and 15.

Figure 16:
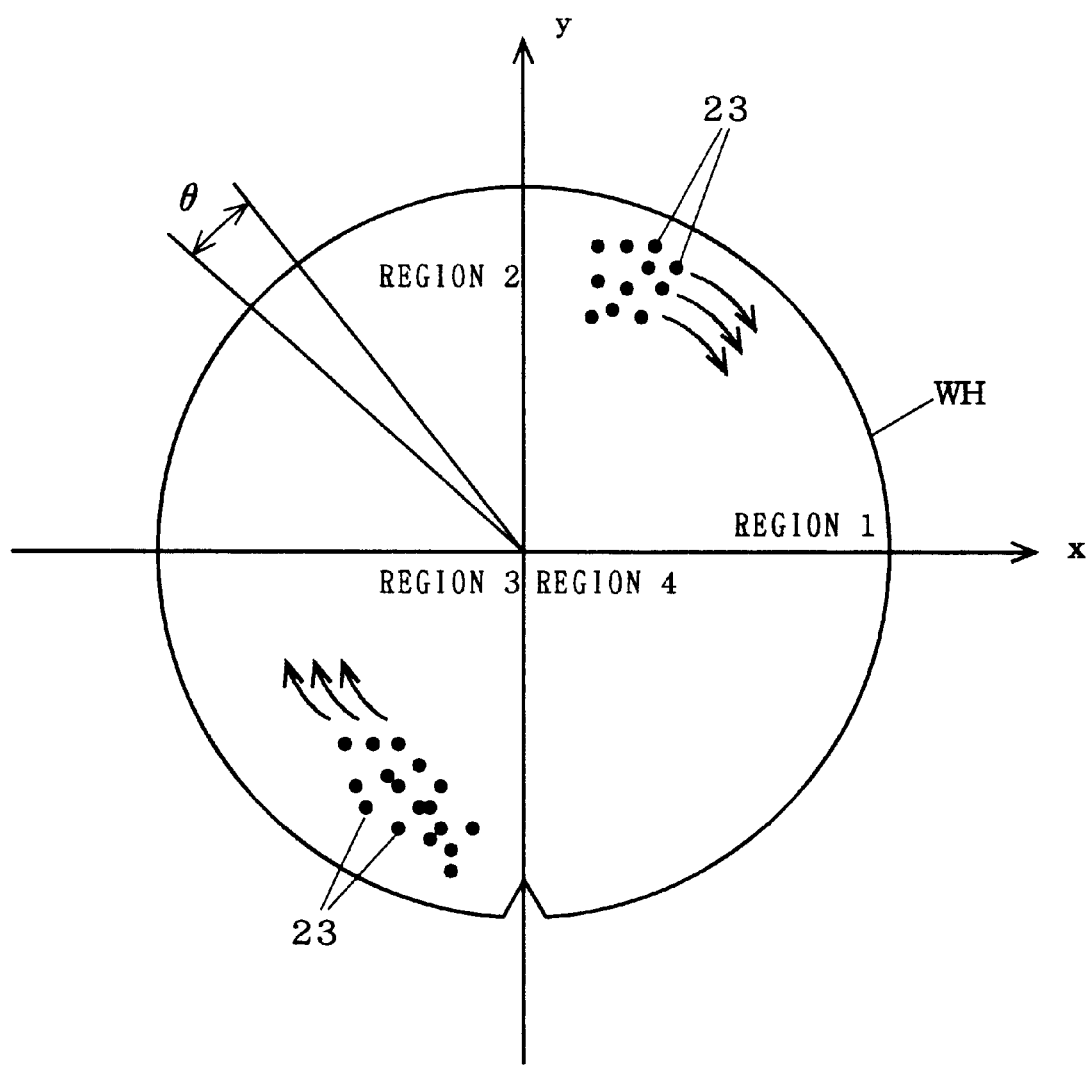
FIG. 16 is a chart for explaining operation of the device according to the fourth embodiment.

When a processing of Step S8 is completed, the routine proceeds to Step S9. Step S9 includes Step S31 and Steps S32. A processing of Step S31 is performed by the region dividing section 55. The region dividing section 55 serves to ideally divide a semiconductor wafer subjected to checking into n (≧2) regions. FIG. 16 is a chart showing an example of division. In this example, a semiconductor wafer WHE subjected to checking is divided into four regions 1 to 4. In other words, n=4 is set in this example. In addition, the regions 1 to 4 are equivalent to first to fourth quadrants of an x- and y-coordinate system (a physical position coordinate system) in which a center of the semiconductor wafer WH is an origin.

When Step S31 is completed, a processing of Steps S32 is performed by a d calculating section 37. The d calculating section 37 individually calculates mean values d1 to dn of a displacement Di for regions 1 to n obtained by the region dividing section 55. The mean value d1 of the displacement Di is calculated in the region 1. Similarly, the mean value d2 of the displacement Di is calculated in the region 2. The mean values are calculated for the regions 3 to n in the same manner.

When the processing of Steps S32 is completed, a processing of Step S33 is performed by a corrected defect position coordinate calculating section 39. The corrected defect position coordinate calculating section 39 calculates a corrected defect position coordinate by using the mean values d1 to dn calculated by the d calculating section 37 for the regions 1 to n obtained by the region dividing section 55, respectively.

For the region 1, x and y components of the mean value d1 are subtracted from x and y components of a coordinate value of each defect so that a corrected defect position coordinate is obtained. For the region 2, x and y components of the mean value d2 are subtracted from x and y components of a coordinate value of each defect so that a corrected defect position coordinate is obtained. For the regions 3 to n, corrected defect position coordinates are obtained in the same manner. Values of the corrected defect position coordinates thus obtained are sent from the corrected defect position coordinate calculating section 39 to a defect position coordinate updating section 40. At Step S11, coordinate values included in defect data stored in a storage medium 15 are updated with the corrected defect position coordinates by the defect position coordinate updating section 40.

In the failure analyzer according to the present embodiment described above, the semiconductor wafer WH subjected to checking is divided into a plurality of regions and a mean value d is calculated for each region. A corrected defect position coordinates are calculated for each region on the basis of the mean values d. Consequently, not only an error of the coordinate values of the defects caused by a shift in one direction of stages provided in defect checking devices 1 and 2 but also an error caused by a shift with rotation can be reduced effectively. Furthermore, if the number n of regions obtained by the division is increased, precision of the corrected defect position coordinates is enhanced more.

In an example of FIG. 16, when there is a shift 0 of rotation of the stage around the center of the semiconductor wafer WH, for example, shifts of the position of defects 23 are varied in central and peripheral portions and directions of the shift in the regions 1 to 4 are comparatively common. Accordingly, the precision of the coordinate values corrected on the basis of the mean values d1 to d4 which are individually calculated in the regions 1 to 4 is much higher than that of the coordinate values corrected on the basis of the calculated mean value d over the whole semiconductor wafer WH. Also in the example of FIG. 16, if the dividing number n is increased, the precision of the corrected defect position coordinate is enhanced more.

<5. Fifth Embodiment>

Figure 17:
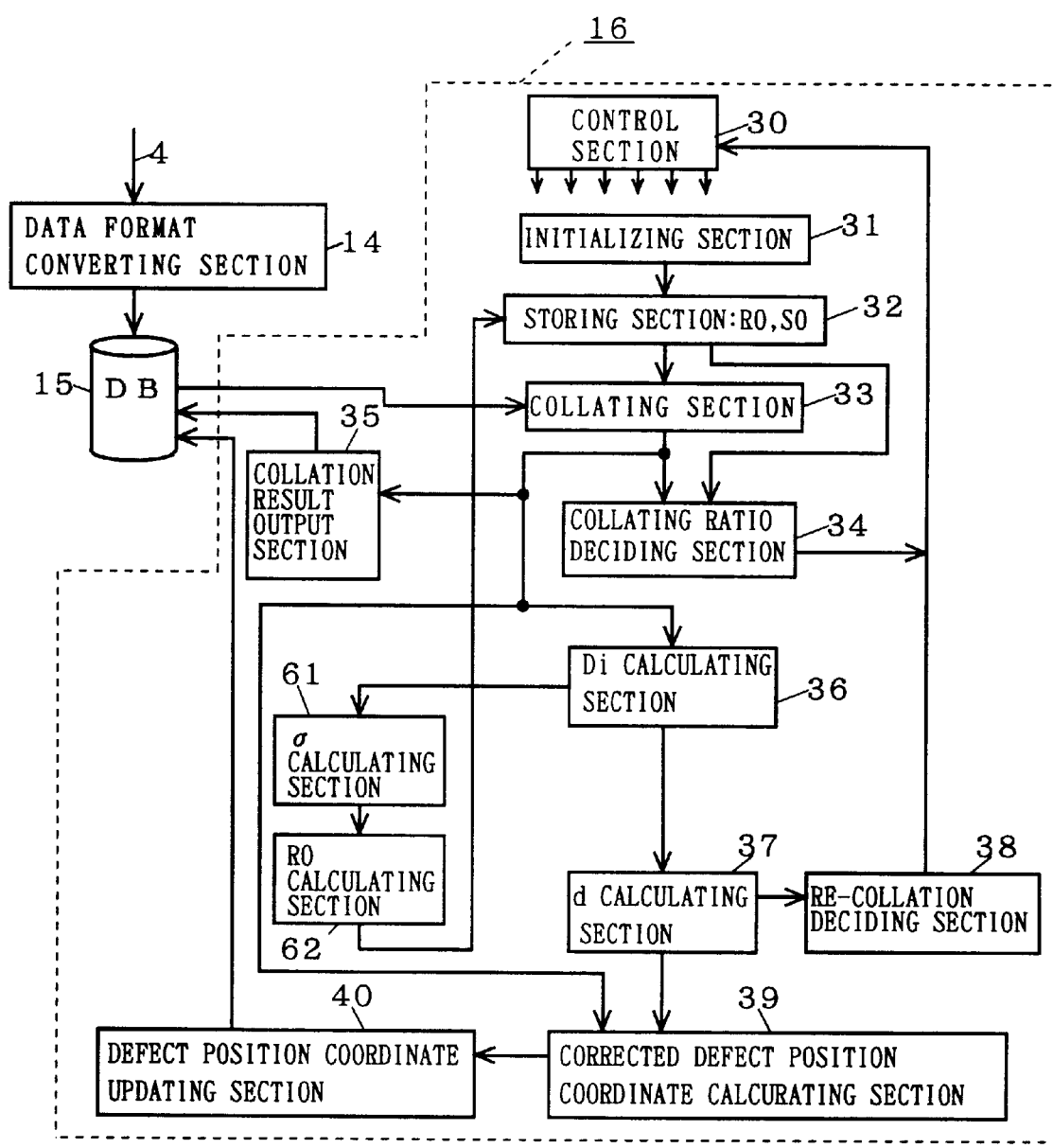
FIG. 17 is a block diagram showing a device according to a fifth embodiment.
Figure 18:
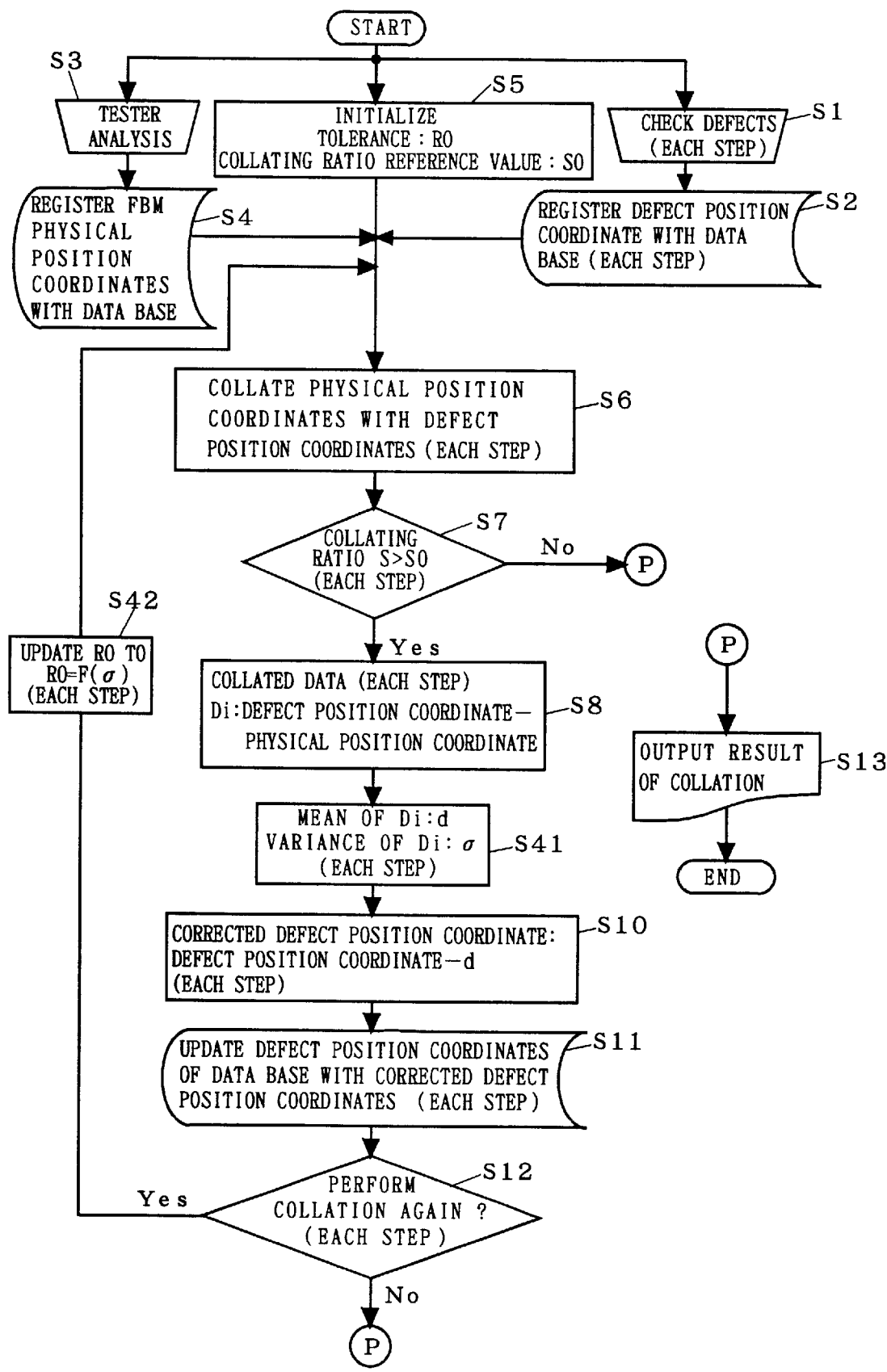
FIG. 18 is a flowchart of a system comprising the device according to the fifth embodiment.

FIG. 17 is a block diagram showing a structure of a failure analyzer according to a fifth embodiment. This failure analyzer is characteristically different from the failure analyzer according to the second embodiment shown in FIG. 8 in that a σ (variance) calculating section 61 is provided and a R0 calculating section 62 is provided in place of the R0 calculating section 41. FIG. 18 is a flowchart showing a flow of operation of a system comprising the failure analyzer. Description will be given below with reference to FIGS. 17 and 18.

When a processing of Step S8 is completed, the routine proceeds to Step S41. A processing of Step S41 is performed by a d calculating section 37 and the σ calculating section 61. As described above, the d calculating section 37 calculates a mean value d of displacements Di calculated by a Di calculating section 36. Around this calculation, the a calculating section 61 calculates a variance σ of the displacements Di. Both the mean value d and the variance σ are calculated for each of x and y components.

More specifically, an x component of the mean value d is calculated as a mean value of x components of all the displacements Di, and a y component of the mean value d is calculated as a mean value of y components of all the displacements Di. Similarly, an x component of the variance a is calculated as a variance of the x components of all the displacements Di, and a y component of the variance a is calculated as a variance of the y components of all the displacements Di. The calculated mean value d is sent to a corrected defect position coordinate calculating section 39, and the variance σ is sent to the R0 calculating section 62. When the processing of Step S41 is completed, the routine proceeds to Step S10. If it is decided at Step S12 that a collation should be executed again, the routine proceeds to Step S42 whose processing is performed by the R0 calculating section 62. The R0 calculating section 62 calculates a tolerance R0 to be newly set on the basis of the variance a calculated by the σ calculating section 61, and updates the tolerance R0 to be stored in a storing section 32 with a value of the new tolerance R0. At succeeding Step S6, the collation is executed again on the basis of the updated tolerance R0.

The variance σ to be used for updating the tolerance R0 may be an absolute value of the variance σ calculated by the a calculating section 61, it may be an x component of the variance σ or a y component thereof, or an operator may select one of them.

In general, the value of the new tolerance R0 is expressed by using a function F of the variance σ.

$$R0 = F(\sigma) \quad (7)$$

The function F is an increasing function for a variable a, and is most simply a proportional function given as follows.

$$F(\sigma) = w \cdot \sigma (w > 0) \quad (8)$$

A constant w is set to 3, for example.

Thus, the tolerance R0 depends on the variance σ. If the variance σ is greater, the tolerance R0 is increased so that a region in which a defect is coincident with a FBM failure is enlarged. Conversely, if the variance a is smaller, the tolerance R0 is decreased so that the region in which a defect is coincident with a FBM failure is reduced.

More specifically, while a first collation is executed on the basis of an initial value of the tolerance R0 which is set a little greater by the operator, second and succeeding collations are executed on the basis of the tolerance R0 which is properly set according to the degree of a variation in the displacement. Consequently, it is possible to prevent defects which are not essentially coincident from being erroneously considered as defects which are coincident. Thus, precision and reliability of a result of the collation can be enhanced still more.

<6. Sixth Embodiment>

Figure 19:
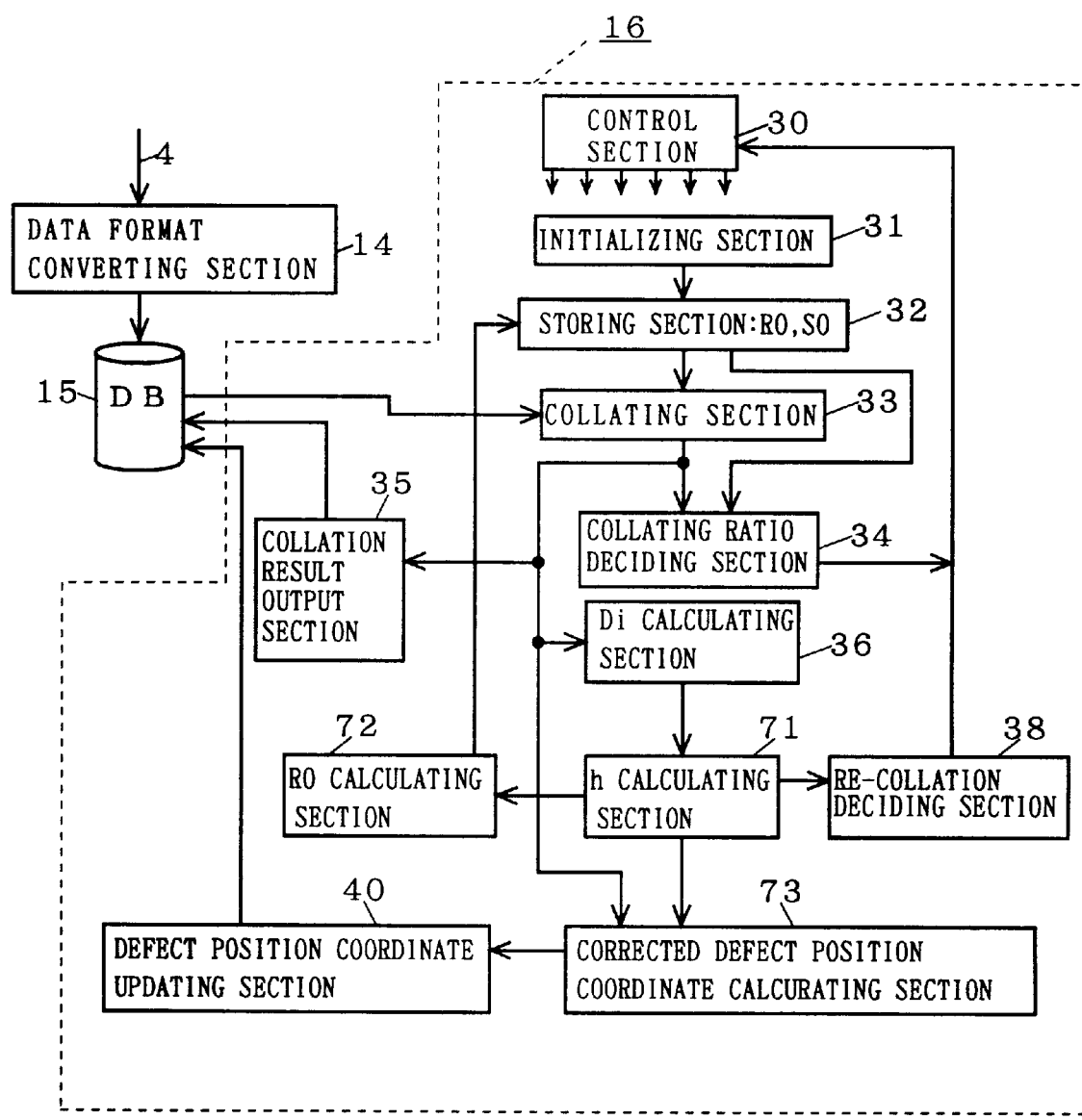
FIG. 19 is a block diagram showing a device according to a sixth embodiment.
Figure 20:
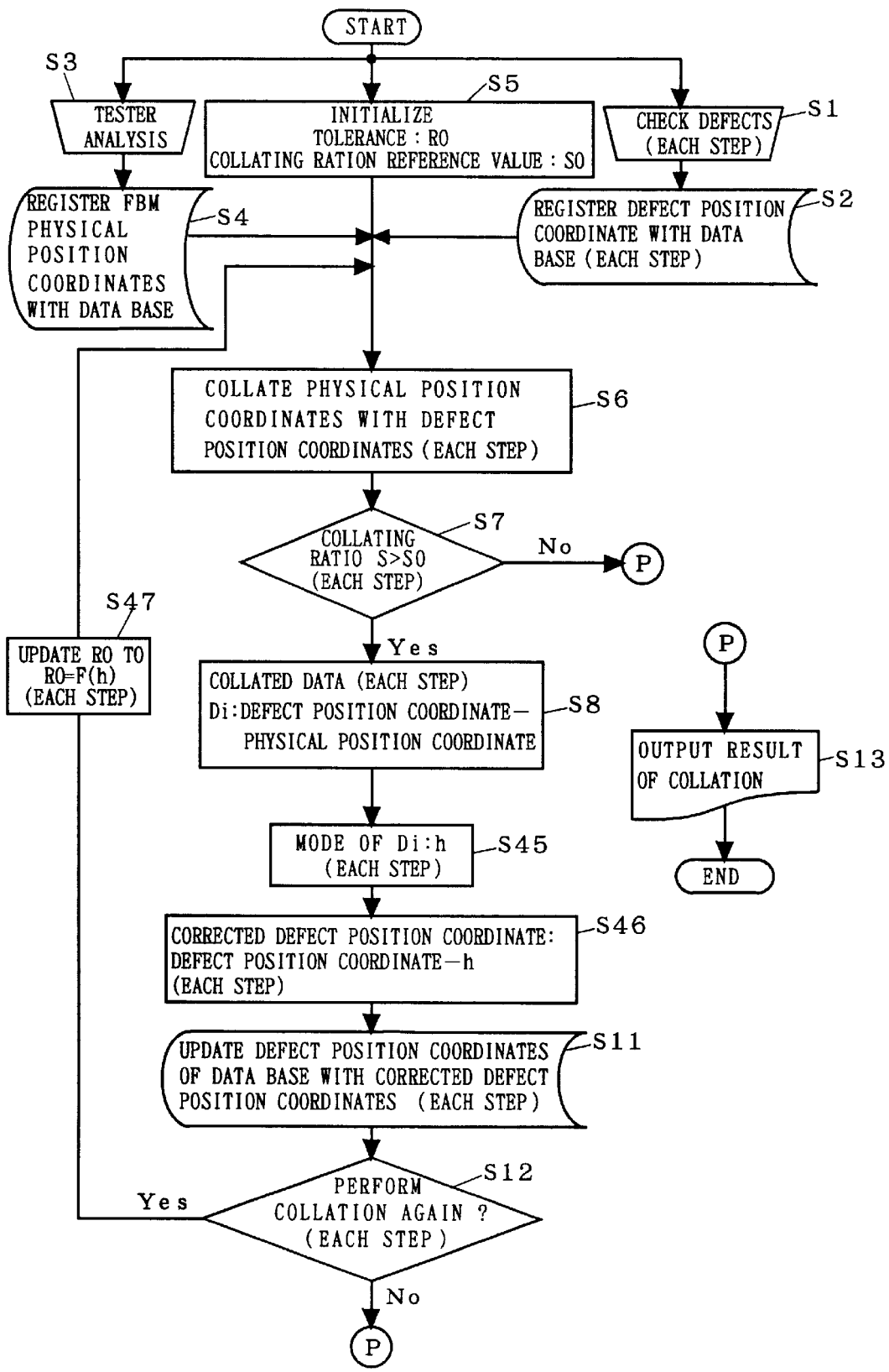
FIG. 20 is a flowchart of a system comprising the device according to the sixth embodiment.

FIG. 19 is a block diagram showing a structure of a failure analyzer according to a sixth embodiment. This failure analyzer is characteristically different from the failure analyzer according to the second embodiment shown in FIG. 8 in that an h (mode) calculating section 71 is provided in place of the d calculating section 37, a corrected defect position coordinate calculating section 73 is provided in place of the corrected defect position coordinate calculating section 39, and a R0 calculating section 72 is provided in place of the R0 calculating section 41. FIG. 20 is a flowchart showing a flow of operation of a system comprising the failure analyzer. Description will be given below with reference to FIGS. 19 and 20.

When a processing of Step S8 is completed, the routine proceeds to Step S45. A processing of Step S45 is performed by the h calculating section 71. The h calculating section 71 calculates a mode h of displacements Di calculated by a Di calculating section 36 on the basis of values of the displacements D1. The mode h is calculated for each of x and y components. In other words, an x component of the mode h is calculated as a mode of x components of all the displacements Di, and a y component of the mode h is calculated as a mode of y components of all the displacements Di. The calculated mode h is sent to the corrected defect position coordinate calculating section 73.

Then, the routine proceeds to Step S46 where a corrected defect position coordinates are calculated by the corrected defect position coordinate calculating section 73. The corrected defect position coordinate calculating section 73 corrects a coordinate value of each defect with the mode h for each of the x and y components. More specifically, the x component of the mode h is subtracted from the x component of the coordinate value of each defect, and the y component of the mode h is subtracted from the y component of the coordinate value of each defect.

The values of the corrected defect position coordinates thus obtained are sent to a defect position coordinate updating section 40. At succeeding Step S11, the defect position coordinate updating section 40 updates, with the corrected defect position coordinates, coordinate values included in defect data stored in a storage medium 15 in the same manner as in the failure analyzer according to the second embodiment.

If it is decided at Step S12 that a collation should be executed again, the routine proceeds to Step S47 whose processing is performed by the R0 calculating section 72. The R0 calculating section 72 calculates a tolerance R0 to be newly set on the basis of the mode h calculated by the h calculating section 71, and updates the tolerance R0 to be stored in a storing section 32 with a value of the new tolerance R0. At succeeding Step S6, the re-collation is executed on the basis of the newly updated tolerance R0.

The mode h to be used for updating the tolerance R0 may be an absolute value of the mode h calculated by the h calculating section 71, it may be an x component of the mode h or a y component thereof, or an operator may select one of them.

In general, the value of the new tolerance R0 is expressed by using a function F of the mode h.

$$R0 = F(h) \qquad (9)$$

The function F is an increasing function for a variable σ, and is most simply a linear function given as follows.

$$F(h) = \alpha \cdot \sigma + \beta \, (\alpha > 0) \qquad (10)$$

More specifically, while a first collation is executed on the basis of an initial value of the tolerance R0 which is set a little greater by the operator, second and succeeding collations are executed on the basis of the tolerance R0 which is properly set according to the mode h.

Figure 21:
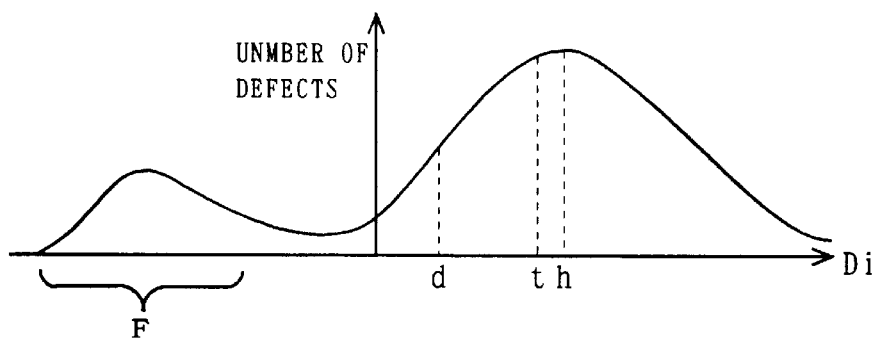
FIG. 21 is a chart for explaining operation of the device according to the sixth embodiment.

FIG. 21 is a graph showing an example of distribution of the number of defects for the displacement Di in order to explain an advantage of correcting coordinate values of defects with the mode h in place of the mean value d. In an example of FIG. 21, a curve has two peaks. The left peak is formed by a group of defects F which are not essentially coincident with the FBM failure but are accidentally considered to be coincident therewith. An accurate shift value of positions of the defects from the FBM failures is "t" equivalent to a center of a group of defects forming the right peak.

However, the mean value d of the displacements Di is greatly shifted to the left from a true shift value "t" due to existence of the group of defects F. On the other hand, since the mode h corresponds to a position of the greatest right peak, it comparatively approximates "t".

With the distribution of defects illustrated in FIG. 21, thus, the mode h reflects the shift value with higher precision than the mean value d. In such a case, a corrected defect position coordinate having higher precision can be obtained by correcting the coordinate value of the defect with the mode h.

For the distribution of the defects shown in FIG. 21, the value of the newly set tolerance R0 which is determined on the basis of the mode h close to the true shift value "t" is more suitable for eliminating the defects which are not essentially coincident with the FBM failure and finding only the defects which should be coincident with the FBM failure. In the failure analyzer according to the present embodiment described above, in the case where the displacements Di of the defects are distributed such that the mode h reflects the shift value with higher precision, precision of the coordinate value of the defects and precision and reliability of a result of the collation can be enhanced.

<7. Seventh Embodiment>

With the distribution of the displacements Di shown in FIG. 21, the mode h is closer to the true shift "t" of the positions of the defects than the mean value d as described above. For any distribution of the displacement Di, however, the mode h does not always reflect the true shift more properly than the mean value d.

Figure 22:
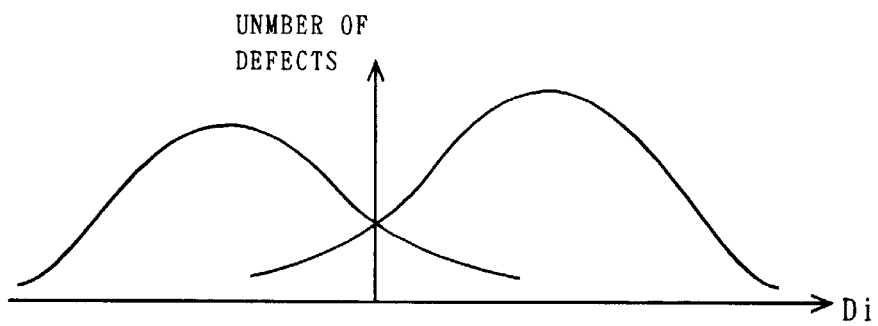
FIG. 22 is a chart for explaining operation of a device according to a seventh embodiment.

FIG. 22 is a graph showing, for example, distribution of an x components of the displacements Di over a whole semiconductor wafer WH obtained when a shift of rotation exists around the central point of the semiconductor wafer WH as illustrated in FIG. 16. At this time, two peaks appear almost symmetrically as shown in FIG. 22. These peaks are not derived from the group of defects F which are accidentally considered to be coincident with the FBM failure as shown in FIG. 21 but are formed by a group of defects which should naturally be considered to be coincident with the FBM failure.

Figure 23:
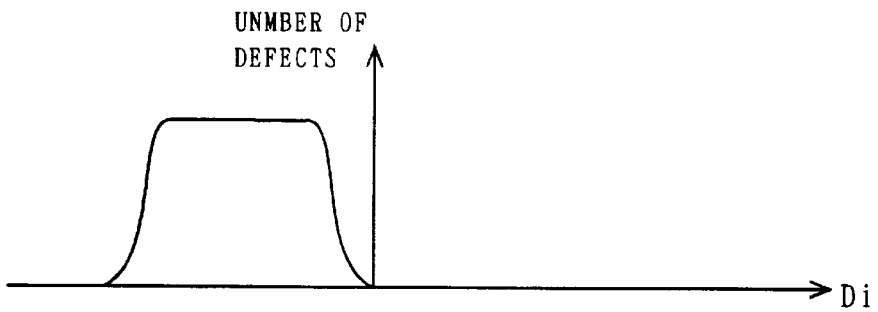
FIG. 23 is a chart for explaining the operation of the device according to the seventh embodiment.

In this case, the mode h is positioned at one of central points of the two peaks. On the other hand, the mean value d is positioned almost close to an origin. With such distribution, a corrected defect position coordinate having higher precision can be obtained by correcting the coordinate values of the defects with the mean value d. Furthermore, a more suitable value can be obtained by setting a new tolerance R0 on the basis of the mean value d. Also in the case where distribution of the displacements Di is represented by a curve having a flat peak as shown in FIG. 23, the same argument is accepted.

In consideration of the foregoing, it is more desirable that one of the mode h and the mean value d should be selected and utilized according to the form of the distribution of the displacements Di. The failure analyzer according to the present embodiment has such a structure as to meet this purpose.

Figure 24:
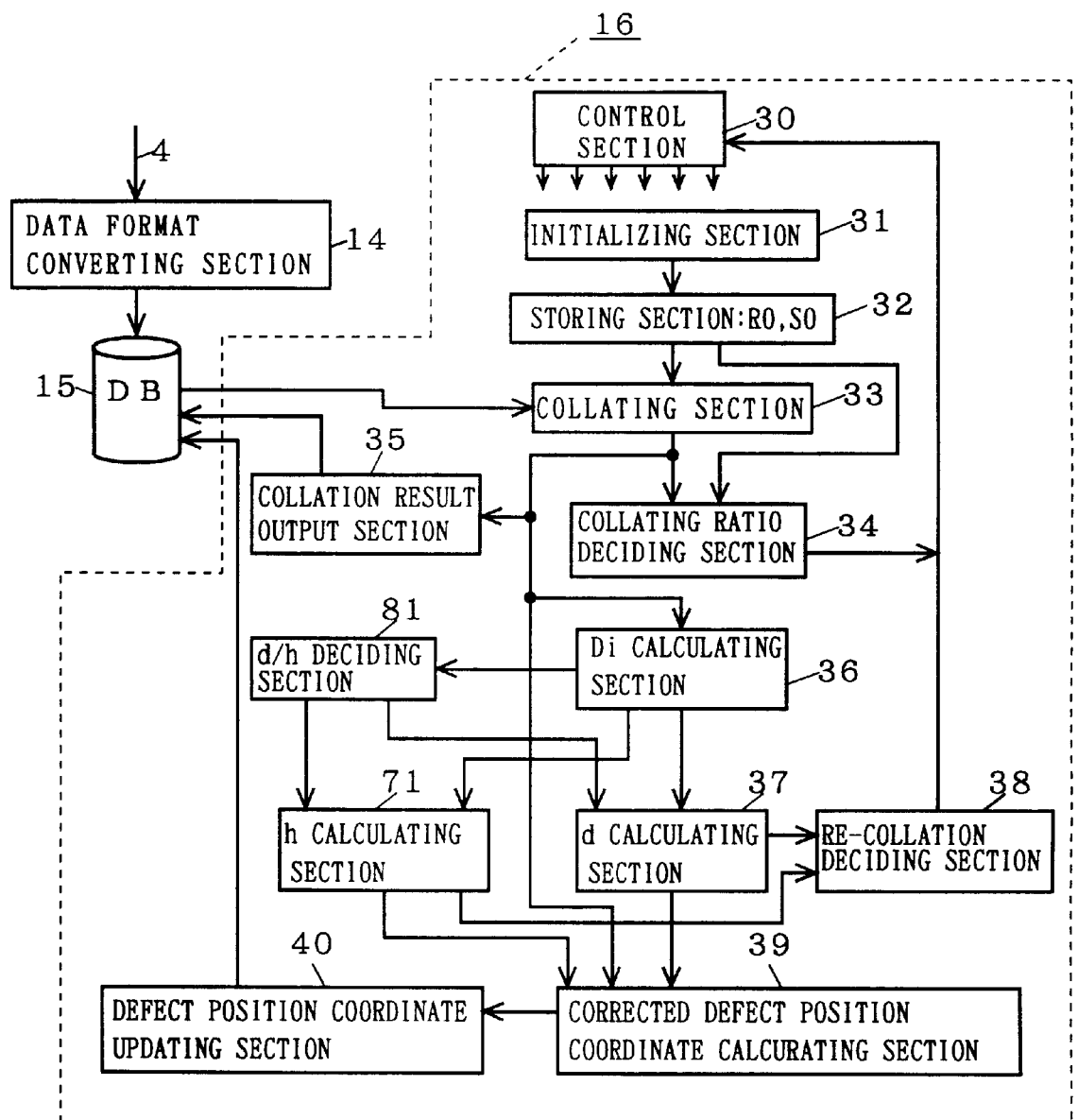
FIG. 24 is a block diagram showing the device according to the seventh embodiment.
Figure 25:
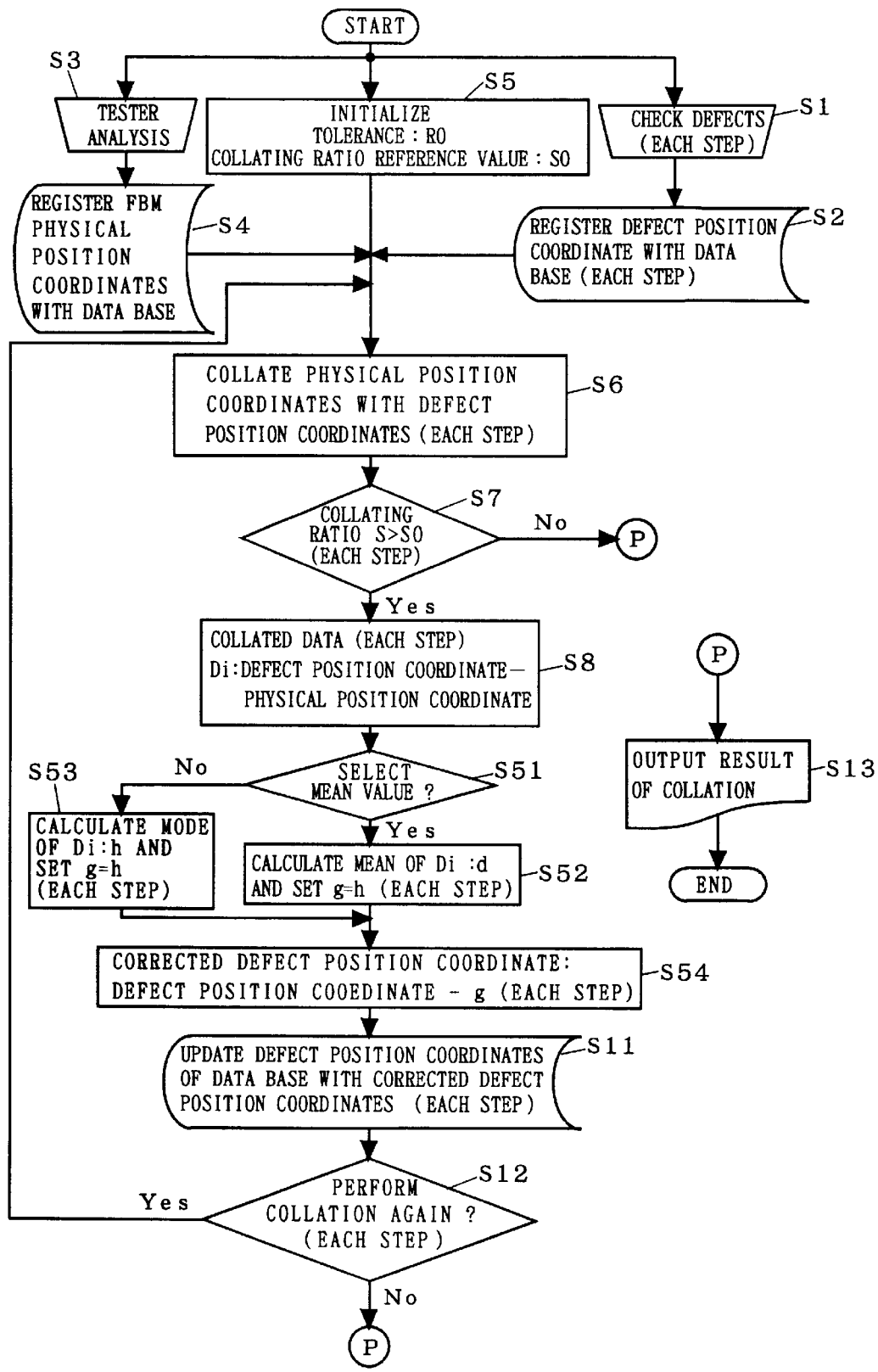
FIG. 25 is a flowchart of a system comprising the device according to the seventh embodiment.

FIG. 24 is a block diagram showing a structure of the failure analyzer according to the present embodiment. This failure analyzer is characteristically different from the failure analyzer according to the first embodiment shown in FIG. 4 in that both of a d calculating section 37 and an h calculating section 71 are provided, and a d/h deciding section (selecting means) 81 is provided. FIG. 25 is a flowchart showing a flow of operation of a system comprising the failure analyzer. Description will be given below with reference to FIGS. 24 and 25.

When a processing of Step S8 is completed, the routine proceeds to Step S51. A processing of Step S51 is performed by the d/h deciding section 81. The d/h deciding section 81 distinguishes distribution of displacements Di calculated by a Di calculating section 36, and decides whether the mean value d or the mode h should be utilized according to a result of distinction. For example, a plurality of types for the distribution of the displacements Di have been prepared, and it has been decided whether the mean value d or the mode h should be selected for each type, and the type to which the distribution of the displacements Di calculated by the Di calculating section 36 belongs is distinguished.

For example, when a position of a peak is clear and the peak is outstandingly higher than any other one as shown in FIG. 21, the mode h should be set for selection. On the other hand, when the position of a peak is clear but another peak having almost the same height exists as shown in FIG. 22 or when the position of the higher peak is not clear as shown in FIG. 23, the mean value d should be set for selection. The type to which the distribution of the displacements Di calculated by the Di calculating section 36 belongs can be decided by using a well-known technique.

If a result of decision that the mean value d should be utilized is obtained at Step S51, the routine proceeds to Step S52. Conversely, if a result of decision that the mode h should be utilized is obtained at Step S51, the routine proceeds to Step S53. At Step S52, the mean value d of the displacements Di is calculated by the d calculating section 37. The procedure for calculation is the same as that for the calculation performed by the d calculating section 37 of the failure analyzer according to the first embodiment (FIG. 4). When the mean value d is calculated, it is given to a variable (correction variable) g which is newly defined.

On the other hand, the mode h of the displacements Di is calculated by the h calculating section 71 at Step S53. The procedure for calculation is the same as that for the calculation performed by the h calculating section 71 of the failure analyzer according to the sixth embodiment (FIG. 19). When the mode h is calculated, it is given to the variable g which is newly defined.

When the processing of Step S52 or S53 is completed, the routine proceeds to Step S54. A processing of Step S54 is performed by the corrected defect position coordinate calculating section 39. The corrected defect position coordinate calculating section 39 executes calculation for subtracting an x component of the variable g from an x component of a coordinate value of each defect and subtracting a y component of the variable g from a y component of the coordinate value of each defect. Accordingly, the corrected defect position coordinate calculating section 39 functions in just the same manner as the corrected defect position coordinate calculating section 39 according to the first embodiment when the processing of Step S52 is performed before Step S54, and functions in just the same manner as the corrected defect position coordinate calculating section 73 according to the sixth embodiment when the processing of Step S53 is performed.

As a result, the coordinates values of the defects are corrected on the basis of the mean value d or mode h selected at Step S51 so that a corrected defect position coordinates are obtained. Values of the corrected defect position coordinates thus obtained are sent to a defect position coordinate updating section 40. The defect position coordinate updating section 40 updates coordinate values included in defect data stored in a storage medium 15 to the values of the corrected defect position coordinates at succeeding Step S11.

At Step S12, a re-collation deciding section 38 decides whether a re-collation should be executed or not on the basis of the variable g for example, that is, the mean value d calculated by the d calculating section 37 or the mode h calculated by the h calculating section 71. As an example, it is decided that the re-collation should be executed if the variable g is greater than a predetermined reference value, and it is decided that the re-collation should not be executed if the variable g is equal to or smaller than the predetermined reference value.

In the failure analyzer according to the present embodiment described above, the coordinate values of the defects are corrected on the basis of the mean value d or mode h which is properly selected depending on the distribution of the displacements Di. Consequently, coordinate values of defects having higher precision can be obtained.

<8. Eighth Embodiment>

It is further desirable that the tolerance R0 should be newly set on the basis of the variable g in the failure analyzer according to the seventh embodiment. A failure analyzer according to the present embodiment has such a structure as to meet this purpose.

Figure 26:
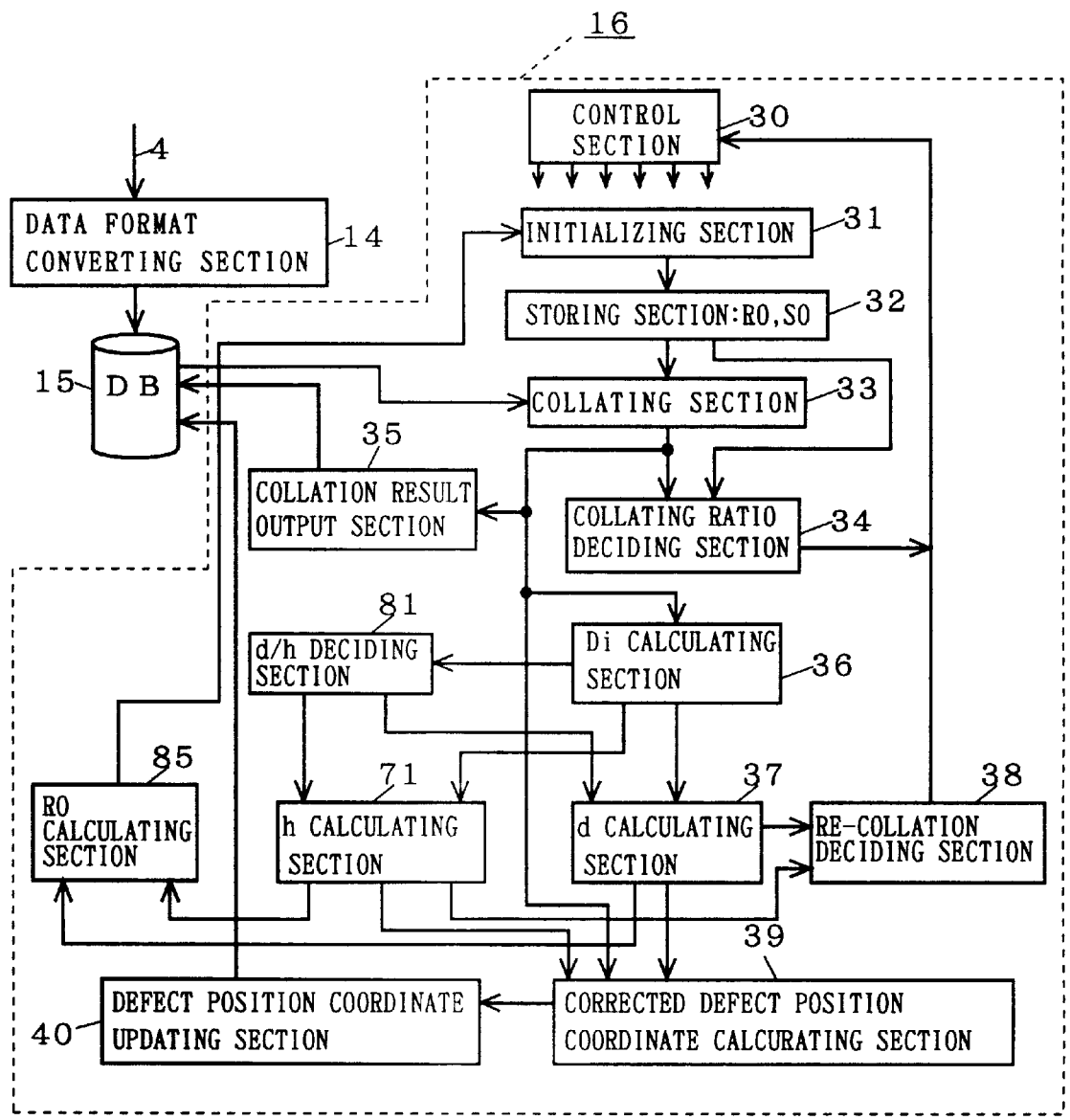
FIG. 26 is a block diagram showing a device according to an eighth embodiment.
Figure 27:
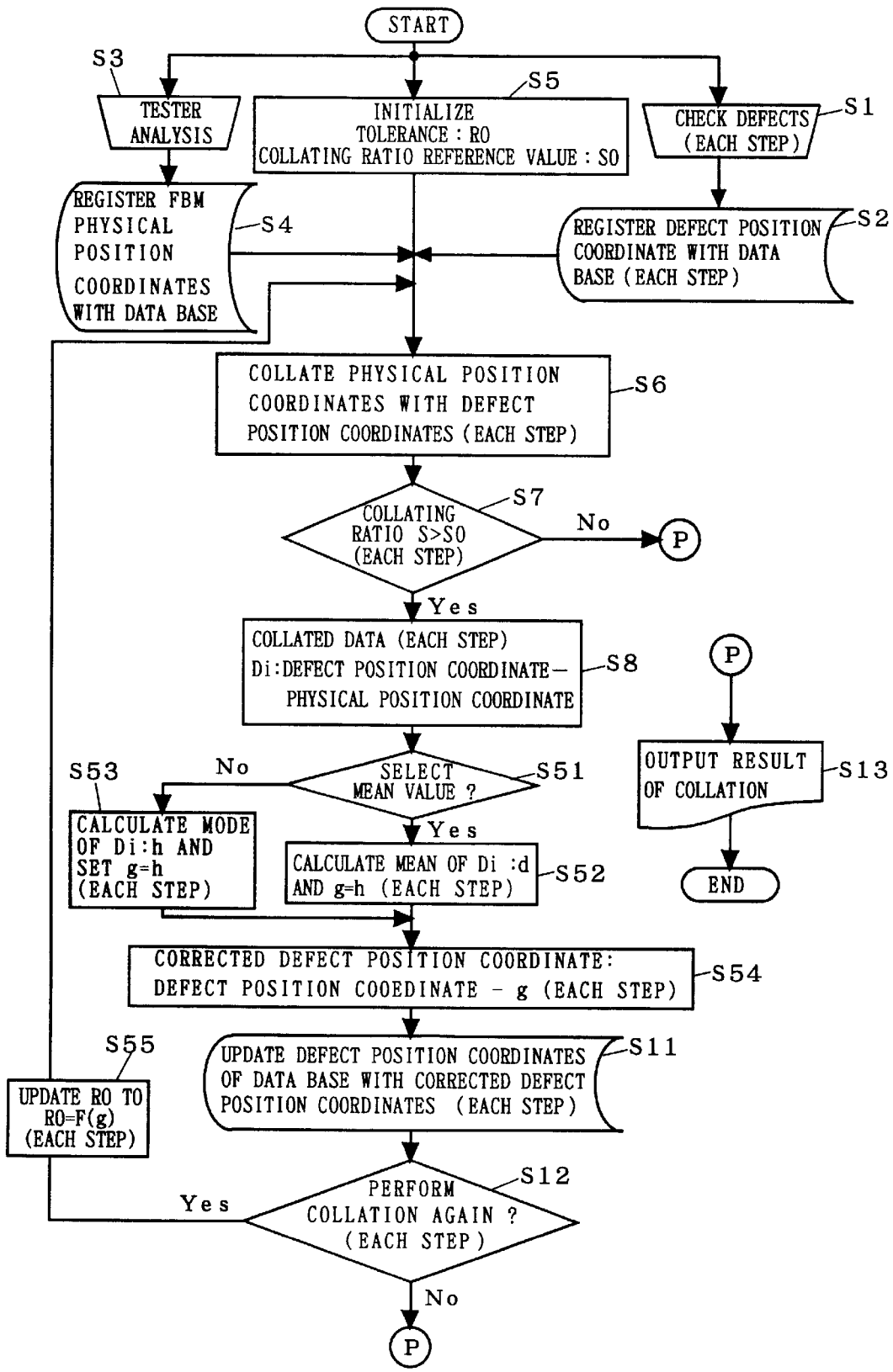
FIG. 27 is a flowchart of a system comprising the device according to the eighth embodiment.

FIG. 26 is a block diagram showing a structure of the failure analyzer according to the present embodiment. This failure analyzer is characteristically different from the failure analyzer according to the seventh embodiment shown in FIG. 24 in that a R0 calculating section 85 is provided. FIG. 27 is a flowchart showing a flow of operation of a system comprising the failure analyzer. Description will be given below with reference to FIGS. 26 and 27.

If it is decided that a re-collation should be executed at Step S12, the routine proceeds to Step S55. A processing of Step S55 is performed by the R0 calculating section 85. The R0 calculating section 85 calculates a tolerance R0 to be newly set on the basis of a variable g, that is, a mean value d calculated by a d calculating section 37 or a mode h calculated by an h calculating section 71. A tolerance R0 to be stored in a storing section 32 is updated with a value of the newly calculated tolerance R0. The re-collation at succeeding Step S6 is executed on the basis of the newly updated tolerance R.

The variable g used for updating the tolerance R0 may be an absolute value of the variable g, it may be an x component of the variable g or a y component thereof, or an operator may select one of them.

The value of the new tolerance R0 is generally expressed by using a function F of the mode h.

$$R0 = F(g) \tag{11}$$

The function F is an increasing function for the variable g, and is most simply a linear function given as follows.

$$F(h) = \gamma \cdot g + \delta, \ (\gamma > 0) \tag{12}$$

More specifically, while a first collation is executed on the basis of an initial value of the tolerance R0 which is set a little greater by the operator, second and succeeding collations are executed on the basis of the tolerance R0 which is properly set according to the variable g, that is, either of the mean value d and the mode h which is properly selected.

In the failure analyzer according to the present embodiment described above, the second and succeeding collations are executed on the basis of the tolerance R0 which is properly set according to the mean value d or the mode h which is properly selected depending on distribution of displacements Di. Consequently, precision and reliability of a result of the collation can be enhanced still more.

The failure analyzers according to the seventh and eighth embodiments have such a structure that the d/h deciding section 81 selects the mean value d or the mode h on the basis of the displacements Di obtained by the Di calculating section 36. However, the failure analyzers can have such a structure that the mean value d or the mode h is selected by the operator's designation. For example, if it has been known that the mean value d or the mode h is more suitable for selection depending on the types of the defect checking devices 1 and 2, the same effects as in the seventh and eighth embodiments can be obtained in the failure analyzer having such a structure.

While the invention has been described in detail, the foregoing description is in all aspects illustrative and not restrictive. It is understood that numerous other modifications and variations can be devised without departing from the scope of the invention.

We claim:

1. A failure analyzer for estimating the cause of failures by collating coordinate values of a first group of failures in a semiconductor wafer which are detected by a tester with coordinate values of a second group of defects in said semiconductor wafer which are detected by defect checking device on the basis of data on said first and second groups, comprising:

initializing means for setting a tolerance and a collating ratio reference value, collating means for retrieving, from said second group, defects coincident with each failure of said first group, that is, defects having coordinate values within said tolerance around a coordinate value of said each failure;

collating ratio deciding means for calculating a collating ratio which is a ratio of failures with which defects are coincident to all failures of said first group, and for comparing said collating ratio with said collating ratio reference value;

displacement calculating means for calculating displacements from each of said failures with which defects are coincident to said coincident defects;

mean value calculating means for calculating a mean value of said displacements as a correction variable;

corrected defect position coordinate calculating means for calculating corrected defect position coordinates by subtracting said correction variable from said coordinate values of said second group;

defect position coordinate updating means for updating said coordinate values of said second group with said corrected defect position coordinates; and control means for letting said defect position coordinate updating means update said coordinate values of said second group only when said collating ratio exceeds said collating ratio reference value in a comparison performed by said collating ratio deciding means.

2. A failure analyzer for estimating the cause of failures by collating coordinate values of a first group of failures in a semiconductor wafer which are detected by a tester with coordinate values of a second group of defects in said semiconductor wafer which are detected by defect checking device on the basis of data on said first and second groups, comprising:

initializing means for setting a tolerance;

collating means for retrieving, from said second group, defects coincident with each failure of said group, that is, defects having coordinate values within said tolerance around a coordinate value of said each failure;

displacement calculating means for calculating displacements from each of said failures with which defects are coincident to said coincident defects;

mode calculating means for calculating a mode of said displacements as a correction variable;

corrected defect position coordinate calculating means for calculating corrected defect position coordinates by subtracting said correction variable from said coordinate values of said second group; and defect position coordinate updating means for updating said coordinate values of said second group with said corrected defect position coordinates.

3. A failure analyzer for estimating the cause of failures by collating coordinate values of a first group of failures in a semiconductor wafer which are detected by a tester with coordinate values of a second group of defects in said semiconductor wafer which are detected by defect checking device on the basis of data on said first and second groups, comprising:

initializing means for setting a tolerance;

collating means for retrieving, from said second group, defects coincident with each failure of said first group, that is, defects having coordinate values within said tolerance around a coordinate value of said each failure;

displacement calculating means for calculating displacements from each of said failures with which defects are coincident to said coincident defects;

mean value calculating means for calculating a mean value of said displacements as a correction variable;

mode calculating means for calculating a mode of said displacements as said correction variable;

selecting means for selecting either of said mean value and said mode;

corrected defect position coordinate calculating means for calculating corrected defect position coordinates by subtracting selected said correction variable from said coordinate values of said second group; and defect position coordinate updating means for updating said coordinate values of said second group with said corrected defect position coordinates.

4. The failure analyzer as defined in claim 3, wherein said selecting means decides, on the basis of distribution of said displacements, whether said mean value or said mode precisely reflects an error of positions between said first and second groups, and selects, as said correction variable, one of said mean value and said mode which is decided to more precisely reflect said error.

5. The failure analyzer as defined in claim 4, wherein said selecting means selects said mode as said correction variable if a position of a highest peak is clear and no other peak having approximately the same height as said highest peak exists in said distribution, and selects said mean value in other cases.

6. The failure analyzer as defined in claim 4, wherein said selecting means selects either of said mode and said mean value as said correction variable according to an operator's designation.

7. The failure analyzer as defined in claim 3, wherein said displacement calculating means calculates, for a line failure of said first group, a displacement in a direction orthogonal to a direction of extension of said line failure as one of said displacements.

8. The failure analyzer as defined in claim 3, wherein said initializing means sets a collating ratio reference value in addition to said tolerance, said failure analyzer further comprising:

collating ratio deciding means for calculating a collating ratio which is a ratio of failures with which defects are coincident to all failures of said first group, and comparing said collating ratio with said collating ratio reference value; and control means for letting said defect position coordinate updating means update said coordinate values of said second group only when said collating ratio exceeds said collating ratio reference value in a comparison performed by said collating ratio deciding means.

9. The failure analyzer as defined in claim 1, wherein said control means controls said collating means in such a manner that said defects are retrieved again by said collating means after said coordinate values of said second group are updated by said defect position coordinate updating means.

10. The failure analyzer as defined in claim 3, further comprising control means for controlling said collating means in such a manner that said defects are retrieved again by said collating means after said coordinate values of said second group are updated by said defect position coordinate updating means.

11. The failure analyzer as defined in claim 10, further comprising recollation deciding means for deciding whether or not said correction variable used by said corrected defect position coordinate calculating means is greater than a constant value, wherein said control means controls said collating means in such a manner that said defects are retrieved again by said collating means after said coordinate values of said second group are updated only when said re-collation deciding means decides that said correction variable is greater than said constant value.

12. The failure analyzer as defined in claim 10, further comprising recollation deciding means for counting a number of times at which said defects are retrieved by said collating means and for deciding whether or not said number is greater than a constant value, wherein said control means controls said collating means in such a manner that said defects are retrieved again by said collating means after said coordinate values of said second group are updated only when said re-collation deciding means decides that said number is smaller than said constant value.

13. The failure analyzer as defined in claim 10, further comprising tolerance calculating means for calculating a value of an increasing function for said correction variable used by said corrected defect position coordinate calculating means and for updating said tolerance with said value of said increasing function.

14. The failure analyzer as defined in claim 13, wherein said increasing function is an increasing function of an absolute value of said correction variable.

15. The failure analyzer as defined in claim 13, wherein said increasing function is a linear function.

16. The failure analyzer as defined in claim 13, wherein said tolerance calculating means individually sets said increasing function for each type of a point failure and two kinds of line failures orthogonal to each other so as to individually update said tolerance for said each type of said failures, and said collating means retrieves said defects by individually using said corresponding tolerance depending on whether each failure of said first group is said point failure or one of said two kinds of orthogonal line failures when retrieving said defects again.

17. The failure analyzer as defined in claim 10, further comprising variance calculating means for calculating a variance of said displacements calculated by said displacement calculating means; and tolerance calculating means for calculating a value of an increasing function for said variance and updating said tolerance with said value of said increasing function.

18. The failure analyzer as defined in claim 17, wherein said increasing function is a function of an absolute value of said variance.

19. The failure analyzer as defined in claim 17, wherein said increasing function is a proportional function.

20. The failure analyzer as defined in claim 3, further comprising region dividing means for dividing said semiconductor wafer into a plurality of regions, wherein said correction variable is individually calculated for said regions.

* * * * *